(12) United States Patent
Seomoon et al.

(10) Patent No.: US 11,398,533 B2
(45) Date of Patent: *Jul. 26, 2022

(54) DISPLAY DEVICE

(71) Applicant: Samsung Display Co., Ltd., Yongin-si (KR)

(72) Inventors: Hee Seomoon, Hwaseong-si (KR); Sung Kook Park, Suwon-si (KR); So Hee Park, Cheonan-si (KR); Bong Hyun You, Seongnam-si (KR); Tae Hee Lee, Hwaseong-si (KR); Won Ki Hong, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/953,145

(22) Filed: Nov. 19, 2020

(65) Prior Publication Data

US 2021/0074773 A1   Mar. 11, 2021

Related U.S. Application Data

(63) Continuation of application No. 16/427,404, filed on May 31, 2019, now Pat. No. 10,861,908.

(30) Foreign Application Priority Data

Aug. 20, 2018   (KR) .................. 10-2018-0096980

(51) Int. Cl.
*H01L 27/32*   (2006.01)
*G06F 3/044*   (2006.01)
(Continued)

(52) U.S. Cl.
CPC ............ *H01L 27/323* (2013.01); *G06F 3/044* (2013.01); *H01L 51/524* (2013.01);
(Continued)

(58) Field of Classification Search
CPC . G06F 2203/04103; G06F 2203/04105; G06F 3/044; H01L 2251/5338;
(Continued)

(56) References Cited

U.S. PATENT DOCUMENTS 7,538,760 B2   5/2009   Hotelling et al.
8,654,524 B2   2/2014   Pance et al.
(Continued)

FOREIGN PATENT DOCUMENTS

EP   2175344   4/2010
EP   2784630   10/2014
(Continued)

OTHER PUBLICATIONS

Extended European Search Report dated Mar. 6, 2020, in European Application No. 19174990.2.
(Continued)

*Primary Examiner* — Krishna P Neupane
(74) *Attorney, Agent, or Firm* — H.C. Park & Associates, PLC

(57) ABSTRACT

A display device including: a display panel; a first force sensor disposed under the display panel; and a waterproofing member disposed under the display panel and disposed adjacent to the first force sensor, a part of the first force sensor and a part of the waterproofing member overlap each other in a height direction of the display panel.

20 Claims, 28 Drawing Sheets

(51) Int. Cl.
*H01L 51/52* (2006.01)
*H05K 1/14* (2006.01)
*H01L 51/00* (2006.01)

(52) U.S. Cl.
CPC ......... *H01L 51/5253* (2013.01); *H05K 1/147* (2013.01); *G06F 2203/04105* (2013.01); *H01L 27/3244* (2013.01); *H01L 51/0097* (2013.01); *H01L 2251/5338* (2013.01); *H05K 2201/10128* (2013.01); *H05K 2201/10151* (2013.01)

(58) Field of Classification Search
CPC ............... H01L 27/3225; H01L 27/323; H01L 27/3244; H01L 51/0097; H01L 51/524; H01L 51/5253; H05K 1/147; H05K 2201/057; H05K 2201/10128; H05K 2201/10151
See application file for complete search history.

(56) References Cited

U.S. PATENT DOCUMENTS

| | | | |
|---|---|---|---|
| 8,686,952 B2 | 4/2014 | Burrough et al. | |
| 8,787,006 B2 | 7/2014 | Golko et al. | |
| 9,274,660 B2 | 3/2016 | Bernstein et al. | |
| 10,551,969 B2 * | 2/2020 | Jeong | G06F 3/0412 |
| 10,852,770 B2 * | 12/2020 | Ichikawa | G06F 1/325 |
| 10,861,908 B2 * | 12/2020 | Seomoon | H01L 27/323 |
| 11,086,438 B2 * | 8/2021 | Park | G06F 3/0412 |
| 2005/0012723 A1 | 1/2005 | Pallakoff | |
| 2007/0257821 A1 * | 11/2007 | Son | G06F 3/0446 |
| | | | 341/22 |
| 2009/0323262 A1 | 12/2009 | Arita | |
| 2010/0134424 A1 | 6/2010 | Brisebois et al. | |
| 2014/0028575 A1 | 1/2014 | Parivar et al. | |
| 2014/0085213 A1 | 3/2014 | Huppi et al. | |
| 2014/0091857 A1 | 4/2014 | Bernstein | |
| 2014/0092064 A1 | 4/2014 | Bernstein et al. | |
| 2014/0253305 A1 | 9/2014 | Rosenberg et al. | |
| 2014/0293145 A1 | 10/2014 | Jones et al. | |
| 2016/0162093 A1 | 6/2016 | Kim et al. | |
| 2016/0326407 A1 | 11/2016 | Iwasaki et al. | |
| 2017/0063421 A1 * | 3/2017 | Moon | G06F 1/1626 |
| 2017/0118319 A1 * | 4/2017 | Jun | H04B 1/3833 |
| 2017/0285815 A1 * | 10/2017 | Yamazaki | G09G 3/3406 |
| 2018/0004333 A1 * | 1/2018 | Jeong | G06F 3/016 |
| 2018/0033571 A1 * | 2/2018 | Choi | G06F 1/1637 |
| 2018/0081485 A1 * | 3/2018 | Shuma | G01L 1/142 |
| 2018/0088736 A1 * | 3/2018 | Jeong | G06F 3/04144 |
| 2018/0210598 A1 | 7/2018 | Lu et al. | |
| 2018/0210600 A1 | 7/2018 | Lee et al. | |
| 2018/0224962 A1 * | 8/2018 | Mori | G06F 3/04164 |
| 2018/0284512 A1 * | 10/2018 | Lee | G06F 1/1686 |
| 2018/0286924 A1 * | 10/2018 | Lee | G02F 1/13338 |
| 2019/0179448 A1 * | 6/2019 | Lim | G06F 3/0445 |
| 2019/0278412 A1 * | 9/2019 | Byeon | G06F 3/0414 |
| 2019/0317634 A1 * | 10/2019 | Lee | G06F 3/0416 |
| 2019/0350099 A1 * | 11/2019 | Ren | G02F 1/133308 |
| 2019/0353540 A1 * | 11/2019 | Hong | G06F 3/04142 |
| 2020/0026422 A1 | 1/2020 | Seomoon et al. | |
| 2020/0042043 A1 * | 2/2020 | Lee | G06F 3/04142 |
| 2020/0042132 A1 * | 2/2020 | Kong | G06F 3/0412 |
| 2020/0042133 A1 * | 2/2020 | Park | G06F 1/1626 |
| 2020/0057503 A1 * | 2/2020 | Seomoon | G06F 3/016 |
| 2020/0057507 A1 * | 2/2020 | Park | G06F 3/04142 |
| 2020/0057522 A1 * | 2/2020 | Hong | G06F 1/1658 |
| 2020/0057545 A1 * | 2/2020 | Seomoon | G06F 3/04883 |
| 2020/0058711 A1 * | 2/2020 | Seomoon | H01L 27/323 |
| 2020/0058712 A1 | 2/2020 | Lee et al. | |
| 2020/0159358 A1 * | 5/2020 | Hong | G01L 1/142 |
| 2020/0227679 A1 * | 7/2020 | Ohara | H01L 51/5293 |
| 2020/0396322 A1 * | 12/2020 | Park | G06F 1/1626 |
| 2021/0102823 A1 * | 4/2021 | Park | G06F 3/0446 |

FOREIGN PATENT DOCUMENTS

| | | |
|---|---|---|
| EP | 2945352 | 11/2015 |
| EP | 3093752 | 11/2016 |
| EP | 3252574 | 12/2017 |
| KR | 10-2019-0132586 | 11/2019 |

OTHER PUBLICATIONS

Partial European Search Report dated Oct. 21, 2019, in European Application No. 19174900.2.
Non-Final Office Action dated Mar. 3, 2020, in U.S. Appl. No. 16/356,208.
Final Office Action dated Jun. 24, 2020, in U.S. Appl. No. 16/356,208.
Non-Final Office Action dated Apr. 15, 2020, in U.S. Appl. No. 16/427,404.
Notice of Allowance dated Aug. 6, 2020, in U.S. Appl. No. 16/427,404.

* cited by examiner

DISPLAY DEVICE

CROSS REFERENCE TO RELATED APPLICATION

This application is a continuation of U.S. patent application Ser. No. 16/427,404, filed on May 31, 2019, which claims priority and the benefit of Korean Patent Application No. 10-2018-0096980, filed on Aug. 20, 2018, which is hereby incorporated by reference for all purposes as if fully set forth herein.

BACKGROUND

Field

Exemplary embodiments/implementations of the invention relate generally to a display device.

Discussion of the Background

A display device for displaying an image is used for various electronic appliances for providing an image to a user, such as smart phones, tablet PCs, digital cameras, notebook computers, navigators, and televisions. The display device includes a display panel for generating and displaying an image and various input devices.

Recently, in the fields of smart phones and tablet PCs, a touch panel recognizing a touch input has been widely applied to a display device. The touch panel has a trend to replace the existing physical input device such as a keypad because of the convenience of touching. Research has been conducted to implement various inputs by mounting a force sensor in addition to the touch panel on a display device.

The above information disclosed in this Background section is only for understanding of the background of the inventive concepts, and, therefore, it may contain information that does not constitute prior art.

SUMMARY

Additional features of the inventive concepts will be set forth in the description which follows, and in part will be apparent from the description, or may be learned by practice of the inventive concepts.

Devices constructed according to exemplary embodiments of the invention provide a waterproof and dustproof display device in which a force sensor is disposed under a display panel in order to realize an input device.

Additional features of the inventive concepts will be set forth in the description which follows, and in part will be apparent from the description, or may be learned by practice of the inventive concepts. According to an exemplary embodiment of the present disclosure, a display device includes: a display panel; a first force sensor disposed under the display panel; and a waterproofing member disposed under the display panel and disposed adjacent to the first force sensor, a part of the first force sensor and a part of the waterproofing member overlap each other in a height direction of the display panel.

The waterproofing member may be disposed on an outer side of the first force sensor.

The display device may further include a frame disposed under the first force sensor; and a first bump disposed between an upper surface of the first force sensor and a lower surface of the display panel or between a lower surface of the first force sensor and an upper surface of the frame.

A height of the first bump may be higher than a height of the first force sensor.

A side surface of the first force sensor facing the waterproof member and a side surface of the first bump may be oblique with respect to the height direction of the display panel.

A width of the first force sensor in a first direction may be larger than a width of the first bump in the first direction.

The waterproofing member may include: a base film; a first adhesive film disposed on one surface of the base film and attached to a lower surface of the frame; and a second adhesive film disposed on the other surface of the base film and attached to the upper surface of the frame.

The first bump may be disposed under the first force sensor, and a width of the first adhesive film in the first direction may be larger than a width of the second adhesive film in the first direction.

The first bump may be disposed on the first force sensor, and a width of the first adhesive film in the first direction may be smaller than a width of the second adhesive film in the first direction.

The base film may include a main portion and a protrusion portion protruding from the main portion, and the protrusion portion may overlap the first force sensor.

The first force sensor may include a force sensing cell, and the force sensing cell may include a driving electrode and a sensing electrode disposed on one surface of a first substrate; and a force sensing layer disposed on one surface of a second substrate facing one surface of the first substrate.

The display device may further include: a second force sensor disposed under the display panel; and a second waterproofing member disposed under the display panel and disposed adjacent to the second force sensor.

The first force sensor may be disposed on one side of the display panel, and the second force sensor may be disposed on the other side of the display panel.

The display panel may include a first flat area and a first curved area extending from one side of the first flat area, and the waterproofing member and the first force sensor may be disposed in the first curved area.

The height direction of the display panel in the first curved area may indicate an extending direction of a radius of curvature of the first curved area.

The display device may further include a lower panel member disposed between the display panel and the first force sensor and between the display panel and the waterproofing member.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
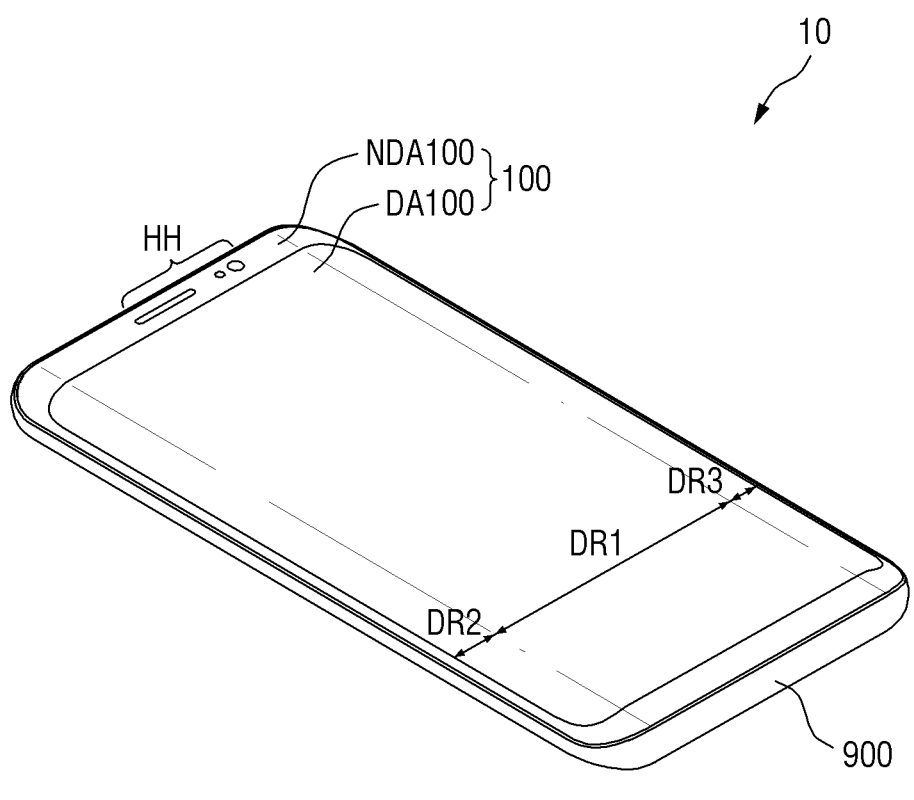
FIG. 1 is a perspective view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z-axes, and may be interpreted in a broader sense. For example, a D1-axis, a D2-axis, and a D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
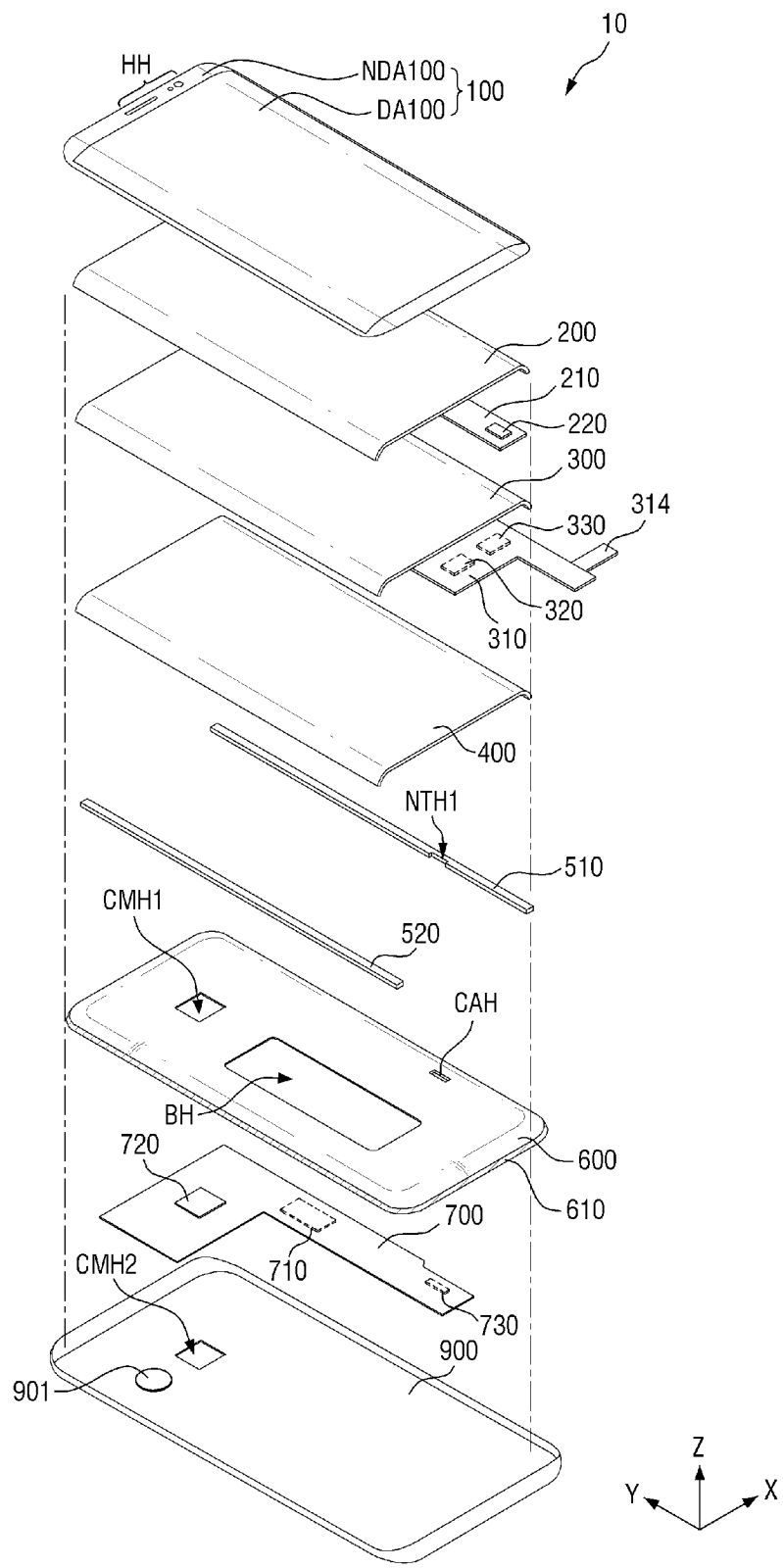
FIG. 2 is an exploded perspective view of a display device according to an exemplary embodiment.

FIG. 1 is a perspective view of a display device according to an exemplary embodiment, and FIG. 2 is an exploded perspective view of a display device according to an exemplary embodiment.

Referring to FIGS. 1 and 2, a display device 10 according to an exemplary embodiment includes a cover window 100, a touch sensing unit 200, a touch circuit board 210, a touch driving unit 220, a display panel 300, a display circuit board 310, a display driving unit 320, a force sensing unit 330, a first force sensor 510, a second force sensor 520, a frame 600, a main circuit board 700, and a lower cover 900.

In this specification, the "on", "over", "top", "upper side", or "upper surface" refers to a direction in which the cover window 100 is disposed, that is, a Z-axis direction, with respect to the display panel 300, and the "beneath", "under", "bottom", "lower side", or "lower surface" refers to a direction in which the middle is frame 600 is disposed, that is, a direction opposite to the Z-axis direction, with respect to the display panel 300. Further, the "left", "right", "upper", and "lower" refer to directions when the display panel 300 is viewed from the plane. For example, the "left" refers to a direction opposite to the X-axis direction, the "right" refers to the X-axis direction, the "upper" refers to the Y-axis direction, and the "lower" refers to a direction opposite to the Y-axis direction.

The display device 10 may have a rectangular shape in a plan view. For example, as shown in FIGS. 1 and 2, the display device 10 may have a rectangular planar shape having short sides in the first direction (X-axis direction) and long sides in the second direction (Y-axis direction). The edge where the short side in the first direction (X-axis direction) meets the long side in the second direction (Y-axis direction) may be formed to have a round shape of a predetermined curvature or have a right angle shape. The planar shape of the display device 10 not limited to a rectangular shape, and may be formed in another polygonal shape, circular shape, or elliptical shape.

The display device 10 may include a first area DR1 formed flat, a second area DR2 extending from the left side of the first area DR1, and a third area DR3 extending from the right side of the first area DR1. The second area DR2 and the third area DR3 may be formed to be flat or curved. When the second area DR2 is formed to be flat, the angle formed by the first area DR1 and the second area DR2 and the angle formed by the first area DR1 and the third area DR3 may be obtuse angles. When the second area DR2 and the third area DR3 are formed to be curved, the second area DR2 and the third area DR3 may have constant curvatures or variable curvatures. In this case, the first area DR1 may be referred to as a flat portion, the second area DR2 may be referred to as a first curved portion, and the third area DR3 may be referred to as a second curved portion.

Although it is shown in FIG. 1 that the second area DR2 extends from the left side of the first area DR1 and the third area DR3 extends from the right side of the first area DR1, the present invention is not limited thereto. That is, any one of the second area DR2 and the third area DR3 may be omitted. The display device 10 may further include a fourth area extending from any one of the upper and lower sides of the first area DR1 in addition to the second area DR2 and the third area DR3.

Figure 14:
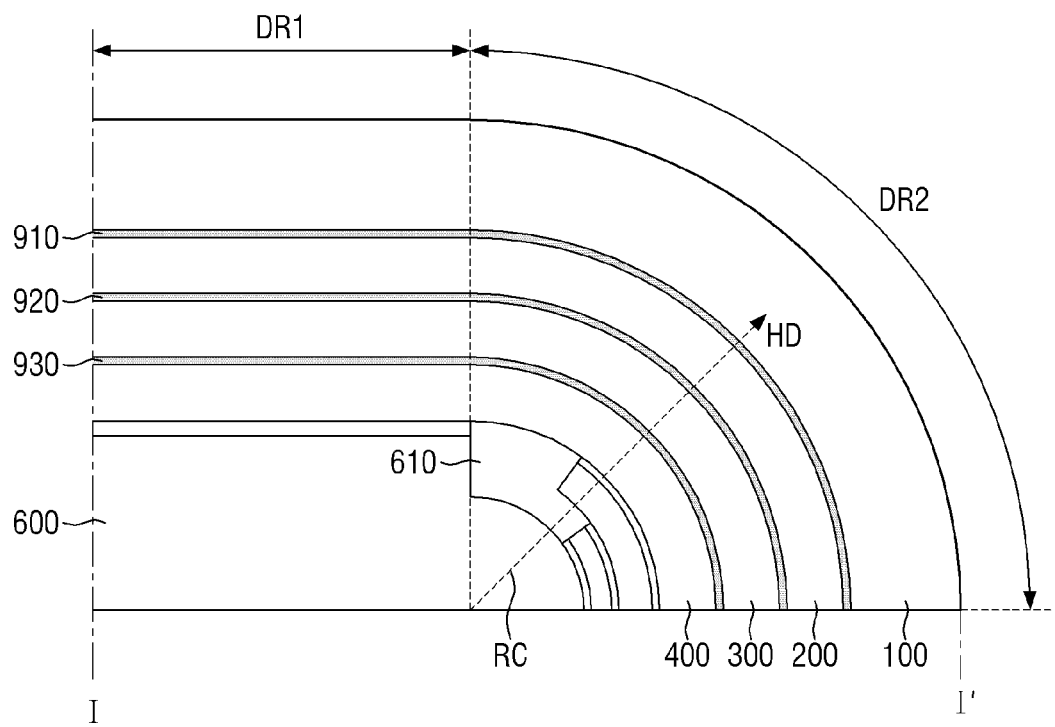
FIG. 14 is a cross-sectional view showing an example of I-I' of FIGS. 3 and 4.

The cover window 100 may be disposed on the display panel 300 so as to cover the upper surface of the display panel 300. Thus, the cover window 100 may function to protect the upper surface of the display panel 300. The cover window 100 may be attached to the touch sensing unit 200 through a first adhesive member 910 as shown in FIG. 14. The first adhesive member 910 may be an optically clear adhesive (OCA) film or an optically clear resin (OCR) film.

The cover window 100 may include a light transmitting area DA100 corresponding to the display panel 300 and a light blocking area NDA100 corresponding to an area other than the display panel 300. The cover window 100 may be disposed in the first area DR1, the second area DR2, and the third area DR3. The light transmitting area DA100 may be disposed in a part of the first area DR1, a part of the second area DR2, and a part of the third area DR3. The light blocking area NDA100 may be formed to be opaque. The light blocking area NDA100 may be formed as a decorative layer having a pattern that can be seen to a user when an image is not displayed. For example, a company logo such as "SAMSUNG" or various characters may be patterned on the light blocking area NDA100. Further, the light blocking area NDA100 may be provided with a plurality of holes HH for exposing a front camera, a front speaker, an infrared sensor, an iris recognition sensor, an ultrasonic sensor, an illuminance sensor, or the like, but the present invention is not limited thereto. For example, some or all of a front camera, a front speaker, an infrared sensor, an iris recognition sensor, an ultrasonic sensor, and an illuminance sensor may be mounted in the display panel 300. In this case, some or all of the plurality of holes HH may be omitted.

The cover window 100 may be made of glass, sapphire, and/or plastic. The cover window 100 may be rigid or flexible.

The touch sensing unit 200 may be disposed between the cover window 100 and the display panel 300. The touch sensing unit 200 may be disposed in the first area DR1, the second area DR2, and the third area DR3. Thus, the touch sensing unit 200 may sense a user's touch in the second areas DR2 and the third area DR3 as well as in the first area DR 1.

The touch sensing unit 200 may be attached to the lower surface of the cover window 100 through the first adhesive member 910 as shown in FIG. 14. The touch sensing unit 200 may be additionally provided thereon with a polarizing film in order to prevent the deterioration of visibility due to the reflection of external light. In this case, the polarizing film may be attached to the lower surface of the cover window 100 through the first adhesive member 910.

The touch sensing unit 200 is a unit for sensing a touch position of a user, and may be implemented as a capacitive type such as a self-capacitance type or a mutual capacitance type. When touch sensing unit 200 is implemented as a self-capacitive type, the touch sensing unit 200 may include only the touch driving electrodes, but when the touch sensing unit 200 is implemented as a mutual capacitance type, the touch sensing unit 200 may include both the touch driving electrodes and the touch sensing electrodes. Hereinafter, the touch sensing unit 200 will be described, assuming that the touch sensing unit 200 is implemented as a mutual capacitance type.

The touch sensing unit 200 may be a panel type or a film type. In this case, the touch sensing unit 200 may be attached onto a thin encapsulation film of the display panel 300 through a second adhesive member 920 as shown in FIG. 14. The second adhesive member 920 may be an optically clear adhesive (OCA) film or an optically clear resin (OCR) film.

The touch sensing unit 200 may be formed integrally with the display panel 300. In this case, the touch driving electrodes and touch sensing electrodes of the touch sensing unit 200 may be disposed on the thin encapsulation film of the display panel 300.

Figure 4:
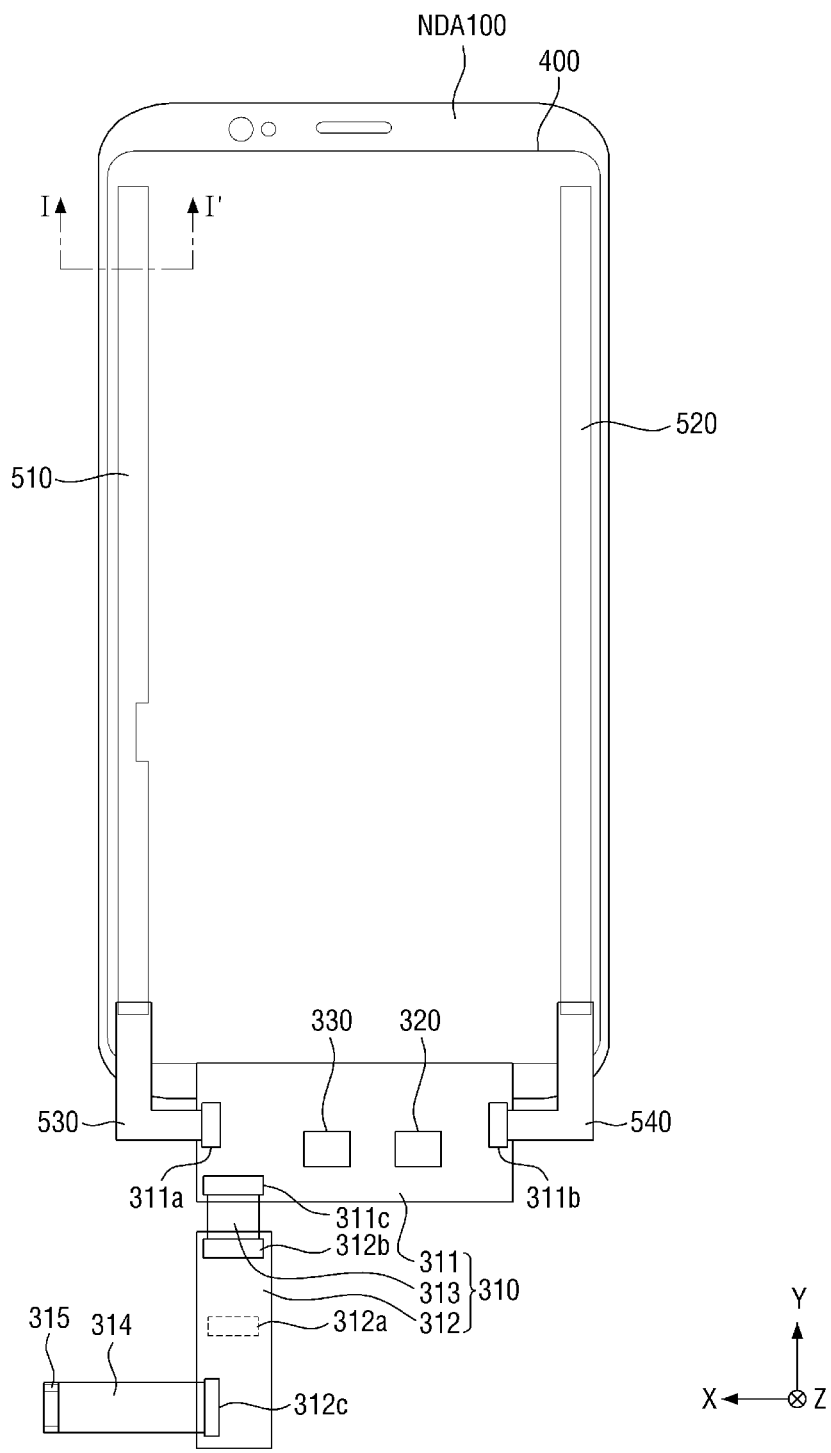
FIG. 4 is a plan view from the bottom showing an example of a display panel attached to a cover window when the display circuit board and third circuit board of FIG. 2 are bent toward the lower surface of the display panel.

The touch circuit board 210 may be attached to one side of the touch sensing unit 200. Specifically, the touch circuit board 210 may be attached onto pads provided on one side of the touch sensing unit 200 using an anisotropic conductive film. Further, the touch circuit board 210 may be provided with a touch connection portion, and the touch connection portion may be connected to a touch connector 312a of the display circuit board 310 as shown in FIG. 4. The touch circuit board 210 may be a flexible printed circuit board.

The touch driving unit 220 may apply touch driving signals to the touch driving electrodes of the touch sensing unit 200, sense sensing signals from the touch sensing electrodes of the touch sensing unit 200, and analyze the sensing signals to calculate a touch position of the user. The touch driving unit 220 may be formed as an integrated circuit and mounted on the touch circuit board 210.

The display panel 300 may be disposed under the touch sensing unit 200. The display panel 300 may be disposed to overlap the light transmitting area 100DA of the touch sensing unit 200. The display panel 300 may be disposed in the first area DR1, the second areas DR2, and the third area DR3. Thus, the image of the display panel 300 may be seen not only in the first area DR1 but also in the second areas DR2 and the third area DR3.

The display panel 300 may be a light emitting display panel including a light emitting element. Examples of the display panel 300 may include an organic light emitting display panel using an organic light emitting diode, an ultra-small light emitting diode display panel using a micro LED, or a quantum dot light emitting diode display panel using a quantum dot light emitting diode. Hereinafter, the display panel 300 will be mainly described as an organic light emitting display panel as shown in FIG. 7.

Figure 7:
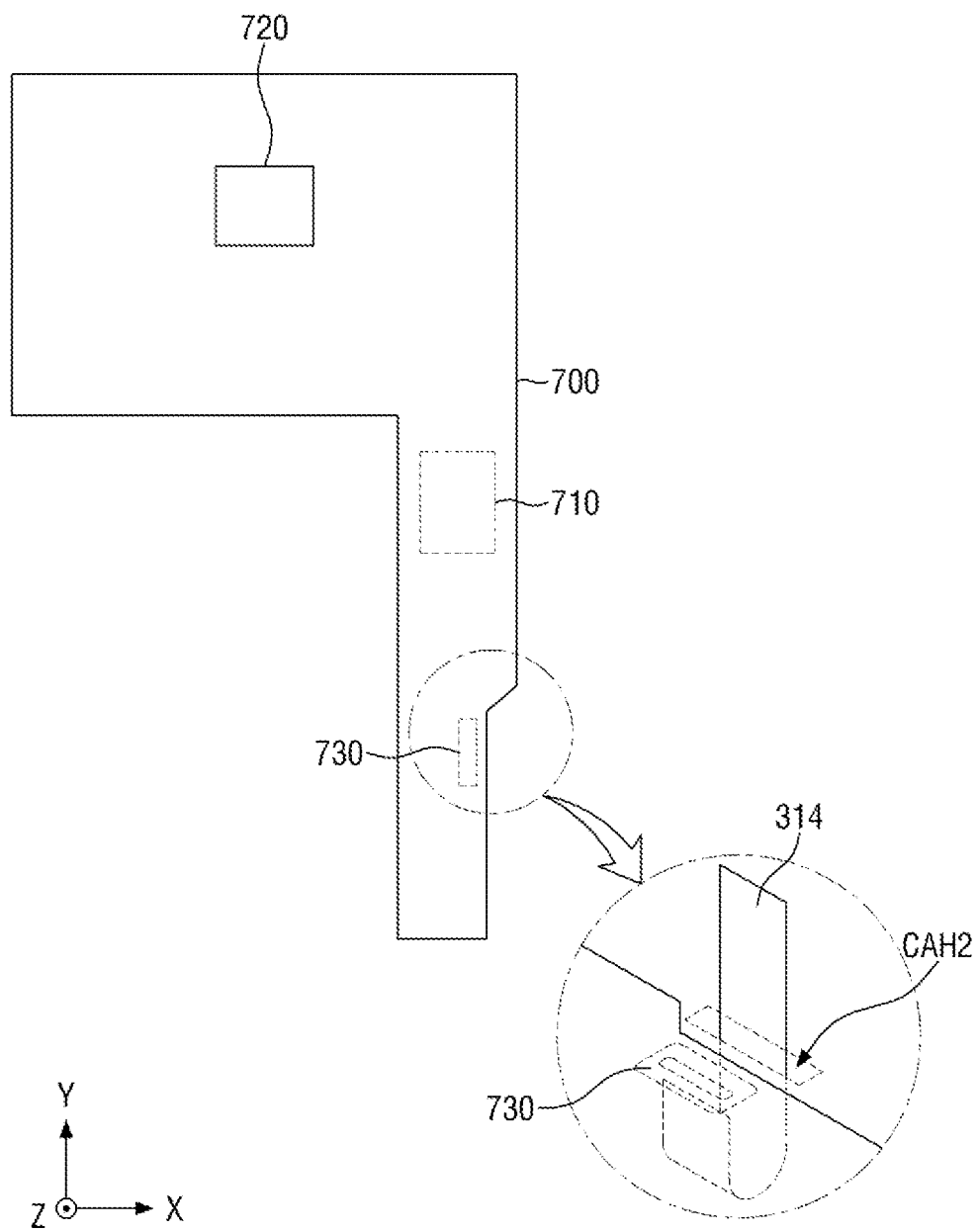
FIG. 7 is a cross-sectional view specifically showing a display area of the display panel.

Referring to FIG. 7, the display area DA of the display panel 300 refers to an area where a light emitting element layer 304 is formed to display an image, and the non-display area NDA thereof refers to an area around the display area DA.

The display panel 300 may include a support substrate 301, a flexible substrate 302, a thin film transistor layer 303, a light emitting element layer 304, a thin film encapsulation layer 305, and a barrier film 306.

The flexible substrate 302 is disposed on the support substrate 301. Each of the support substrate 301 and the flexible substrate 302 may include a polymer material having flexibility. For example, each of the support substrate 301 and the flexible substrate 302 may include polyethersulphone (PES), polyacrylate (PA), polyarylate (PAR), polyetherimide (PEI), polyethylenenapthalate (PEN), polyethylene terepthalate (PET), polyphenylenesulfide (PPS), polyallylate, polyimide (PI), polycarbonate (PC), cellulosetriacetate (CAT), cellulose acetate propionate (CAP), or a combination thereof.

The thin film transistor layer 303 is disposed on the flexible substrate 302. The thin film transistor layer 303 includes thin film transistors 335, a gate insulating film 336, an interlayer insulating film 337, a protective film 338, and a planarization film 339.

A buffer film may be formed on the flexible substrate 302. The buffer film may be formed on the flexible substrate 302 so as to protect thin film transistors 335 and light emitting elements from moisture penetrating through the support substrate 301 and the flexible substrate 302 which are vulnerable to moisture. The buffer film may be formed of a plurality of alternately laminated inorganic films. For example, the buffer film may be formed of a multi-layer film in which one or more inorganic layers including one or more of a silicon oxide (SiOx), a silicon nitride (SiNx), and SiON are alternately stacked. The buffer film may be omitted.

The thin film transistor 335 is formed on the buffer film. The thin film transistor 335 includes an active layer 331, a gate electrode 332, a source electrode 333, and a drain electrode 334. Although it is shown in FIG. 7 that the thin film transistor 335 is formed by a top gate manner in which the gate electrode 332 is located on the active layer 331, it should be noted that the present invention is not limited thereto. That is, the thin film transistor 335 may be formed by a bottom gate manner in which the gate electrode 332 is located beneath the active layer 331, or may be formed by a double gate manner in which the gate electrode 332 is located both on and beneath the active layer 331.

The active layer 331 is formed on the buffer film. The active layer 331 may be formed of a silicon-based semiconductor material or an oxide-based semiconductor material. A light blocking layer for blocking external light incident on the active layer 331 may be formed between the buffer film and the active layer 331.

The gate insulating film 336 may be formed on the active layer 331. The gate insulating film 336 may be formed of an inorganic film, for example, a silicon oxide (SiOx) film, a silicon nitride (SiNx) film, or a combination thereof.

The gate electrode 332 and a gate line may be formed on the gate insulating film 336. The gate electrode 332 and the gate line may be formed of a single layer or a multi-layer including at least one of molybdenum (Mo), aluminum (Al), chromium (Cr), gold (Au), titanium (Ti), nickel (Ni), neodymium (Nd) and copper (Cu), or an alloy thereof.

The interlayer insulating film 337 may be formed on the gate electrode 332 and the gate line. The interlayer insulating film 337 may be formed of an inorganic film, for example, a silicon oxide ($SiO_x$) film, a silicon nitride ($SiN_x$) film, or a combination thereof.

The source electrode 333, the drain electrode 334, and a data line may be formed on the interlayer insulating film. Each of the source electrode 333 and the drain electrode 334 may be connected to the active layer 331 through a contact hole penetrating the gate insulating film 336 and the interlayer insulating film 337. The source electrode 333, the drain electrode 334, and the data line may be formed of a single layer or a multi-layer including at least one of molybdenum (Mo), aluminum (Al), chromium (Cr), gold (Au), titanium (Ti), nickel (Ni), neodymium (Nd) and copper (Cu), or an alloy thereof.

The protective film 338 for insulating the thin film transistor 335 may be formed on the source electrode 333, the drain electrode 334, and the data line. The protective film 338 may be formed of an inorganic film, for example, a silicon oxide ($SiO_x$) film, a silicon nitride ($SiN_x$) film, or a combination thereof.

The planarization film 339 for flattening a step due to the thin film transistor 335 may be formed on the protective film 338. The planarization film 339 may be formed of an organic film including an acryl resin, an epoxy resin, a phenolic resin, a polyamide resin, or a polyimide resin.

The light emitting element layer 304 is formed on the thin film transistor layer 303. The light emitting element layer 304 includes light emitting elements and a pixel defining film 344.

The light emitting elements and the pixel defining film 344 are formed on the planarization film 339. The light emitting element may be an organic light emitting element. In this case, the light emitting element may include an anode electrode 341, a light emitting layer 342, and a cathode electrode 343.

The anode electrode 341 may be formed on the planarization film 339. The anode electrode 341 may be connected to the source electrode 333 of the thin film transistor 335 through a contact hole penetrating the protective film 338 and the planarization film 339.

The pixel defining film 344 may be formed on the planarization film 339 to cover the edge of the anode electrode 341 so as to partition pixels. That is, the pixel defining film 344 serves to define pixels. Each of the pixels refers to an area where the anode electrode 341, the light emitting layer 342, and the cathode electrode 343 are sequentially laminated, and holes from the anode electrode 341 and electrons from the cathode electrode 343 are combined with each other in the light emitting layer 342 to emit light.

The light emitting layer 342 is formed on the anode electrode 341 and the pixel defining film 344. The light emitting layer 342 is an organic light emitting layer. The light emitting layer 342 may emit one of red light, green light, and blue light. The peak wavelength range of red light may be about 620 nm to 750 nm, and the peak wavelength range of green light may be about 495 nm to 570 nm. Further, the peak wavelength range of blue light may be about 450 nm to 495 nm. The light emitting layer 342 may be a white light emitting layer that emits white light. In this case, the light emitting layer 342 may have a laminate structure of a red light emitting layer, a green light emitting layer, and a blue light emitting layer, and may be a common layer formed commonly in the pixels. In this case, the display panel 300 may further include color filters for displaying red, green, and blue colors.

The light emitting layer 342 may include a hole transporting layer, a light emitting layer, and an electron transporting layer. Further, the light emitting layer 342 may be formed to have a tandem structure of two stacks or more, and in this case, a charge generating layer may be formed between the stacks.

The cathode electrode 343 is formed on the light emitting layer 342. The cathode electrode 343 may be formed to cover the light emitting layer 342. The cathode electrode 343 may be a common layer formed commonly in the pixels.

When the light emitting element layer 304 is formed by a top emission manner in which light is emitted upward, the anode electrode 341 may be formed of a high-reflectance metal material such as a laminate structure (Ti/Al/Ti) of aluminum and titanium, a laminate structure (ITO/Al/ITO) of aluminum and TM, an APC alloy, or a laminate structure (ITO/APC/ITO) of an APC alloy and ITO. The APC alloy may be an alloy of silver (Ag), palladium (Pd), and copper alloy (Cu). The cathode electrode 343 may be formed of a transparent conductive material (TCO) such as ITO or IZO, which is light-transmissive, or a semi-transmissive conductive material such as magnesium (Mg), silver (Ag), or an alloy of magnesium (Mg) and silver (Ag). When the cathode electrode 343 is formed of a semi-transmissive conductive material, light emission efficiency may be increased by a microcavity.

When the light emitting element layer 304 is formed by a bottom emission manner in which light is emitted downward, the anode electrode 341 may be formed of a transparent conductive material (TCO) such as ITO or IZO, or a semi-transmissive conductive material such as magnesium (Mg), silver (Ag), or an alloy of magnesium (Mg) and silver (Ag). The cathode electrode 343 may be formed of a high-reflectance metal material such as a laminate structure (Ti/Al/Ti) of aluminum and titanium, a laminate structure (ITO/Al/ITO) of aluminum and TIO, an APC alloy, or a laminate structure (ITO/APC/ITO) of an APC alloy and ITO. When the anode electrode 341 is formed of a semi-transmissive conductive material, light emission efficiency may be increased by a microcavity.

The thin film encapsulation layer 305 is formed on the light emitting element layer 304. The thin film encapsulation layer 305 serves to prevent oxygen or moisture from permeating the light emitting layer 342 and the cathode electrode 343. For this purpose, the thin film encapsulation layer 305 may include at least one inorganic film. The inorganic film may be formed of silicon nitride, aluminum nitride, zirconium nitride, titanium nitride, hafnium nitride, tantalum nitride, silicon oxide, aluminum oxide, or titanium oxide. The thin film encapsulation layer 305 may further include at least one organic film. The organic film may be formed to have a sufficient thickness to prevent foreign matter (particles) from penetrating the thin film encapsulation layer 305 and entering the light emitting layer 342 and the cathode electrode 343. The organic film may include any one of epoxy, acrylate, and urethane acrylate.

The display circuit board 310 may be attached to one side of the display panel 300. Specifically, the display circuit board 310 may be attached onto pads provided on one side of the display panel 300 using an anisotropic conductive film.

The display circuit board 310 may be bent at least once. The display circuit board 310 may be attached to the upper surface or lower surface of the display panel 300, and may be bent to the lower side of the display panel 300, that is, the lower side of the lower panel member 400. The touch circuit board 210 may also be attached to the upper surface of the touch sensing unit 200, and may be bent to the lower side of the display panel 300, that is, the lower side of the lower panel member 400. Thus, the touch connection portion provided at one end of the touch circuit board 210 may be connected to the touch connector 312a of the display circuit board 310. Details of the display circuit board 310 will be described later with reference to FIGS. 3 to 6.

The display driving unit 320 outputs signals and voltages for driving the display panel 300 through the display circuit board 310. The display driving unit 320 may be formed as an integrated circuit and mounted on the display circuit board 310, but the present invention is not limited thereto. For example, the display driving unit 320 may be attached directly to the substrate of the display panel 300. In this case, the display driving unit 320 may be attached to the upper surface or lower surface of the display panel 300.

The lower panel member 400 may be disposed under the display panel 300. The lower panel member 400 may be attached to the lower surface of the display panel 300 through the third adhesive member 930 as shown in FIG. 14. The third adhesive member 930 may be an optical clear adhesive (OCA) film, an optical clear resin (OCR) film, or a pressure sensitive adhesive (PSA).

The lower panel member 400 may include at least one of a light absorbing member for absorbing external light, a buffer member for absorbing an external impact, a heat dissipating member for efficiently emitting heat of the display panel 300, and a light blocking layer for blocking external light.

The light absorbing member may be disposed under the display panel 300. The light absorbing member inhibits the transmission of light to prevent components disposed under the light absorbing member, that is, a first force sensor 510, a second force sensor 520, the display circuit board 310, a first flexible circuit board 530, a second flexible circuit board 540, and the like from being viewed from above the display panel 300. The light absorbing member may include a light absorbing material such as a black pigment or a dye.

The buffer member may be disposed under the light absorbing member. The buffer member absorbs an external impact to prevent the display panel 300 from being damaged. The buffer member may be composed of a single layer or a plurality of layers. For example, the buffer member may be formed of a polymer resin such as polyurethane, polycarbonate, polypropylene, or polyethylene, or may be formed of an elastic material such as a rubber, a urethane material, or a sponge formed by foaming an acrylic material. The buffer member may be a cushion layer.

The heat dissipating member may be disposed under the buffer member. The heat dissipating member may include a first heat dissipating sheet including graphite or carbon nanotubes and a second heat dissipating sheet capable of blocking electromagnetic waves and formed of a metal thin film of copper, nickel, ferrite or silver having excellent thermal conductivity.

The first force sensor 510 may be disposed in the second area DR2 corresponding to the first curved surface portion, and the second force sensor 520 may be disposed in the third area DR3 corresponding to the second curved surface portion. That is, the first force sensor 510 may be disposed under the display panel 300 at the right edge of the display panel 300. The second force sensor 520 may be disposed under the display panel 300 at the left edge of the display panel 300. As shown in FIGS. 1 and 2, the left and right sides of the display panel 300 face each other. The first force sensor 510 and the second force sensor 520 may be attached to the lower surface of the lower panel member 400.

Figure 8:
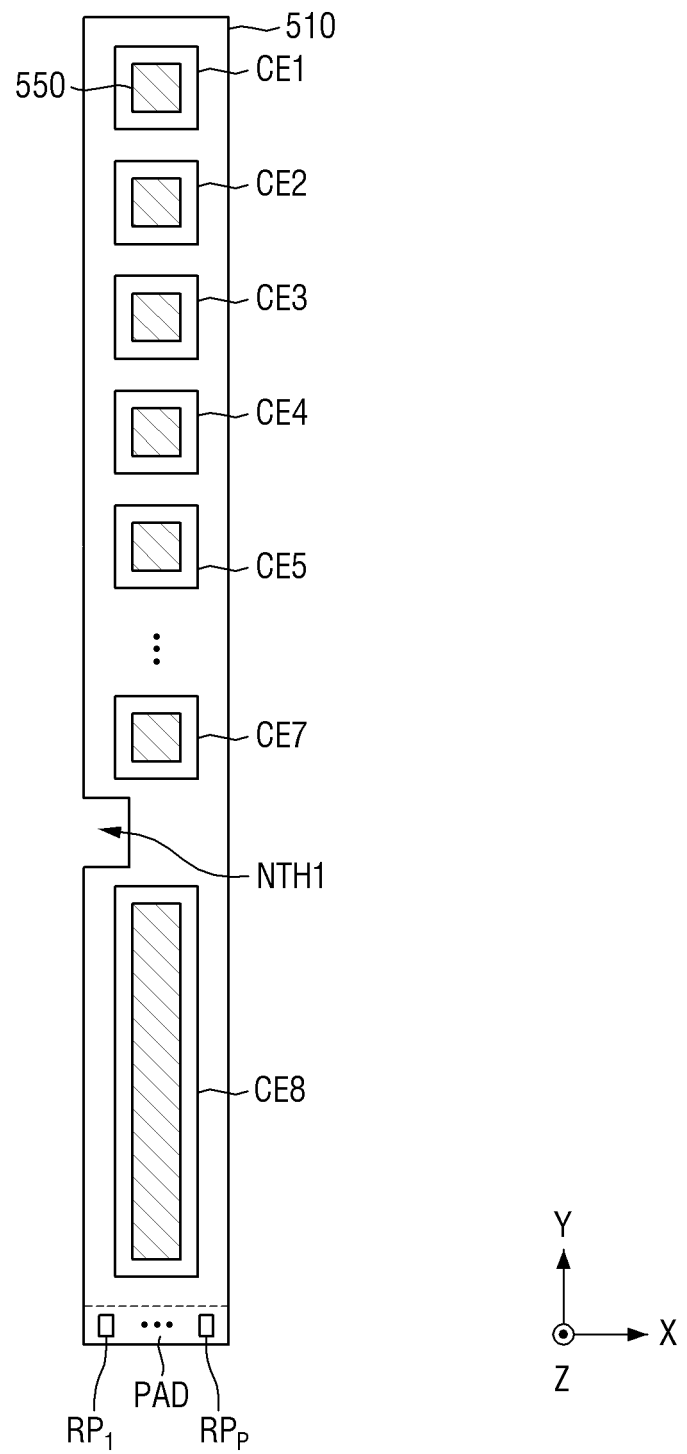
FIG. 8 is a plan view showing a first force sensor and first bumps according to an embodiment.

As shown in FIG. 8, first bumps 550 may be disposed on the first force sensor 510. Each of the first bumps 550 may be attached to the lower surface of the lower panel member 400 through a fourth adhesive member 940, and may be attached to the upper surface of the first force sensor 510 through a sixth adhesive member 960. Further, the first force sensor 510 may be attached to the upper surface of the frame 600 through a fifth adhesive member 950. The fourth adhesive member 940, the fifth adhesive member 950, and the sixth adhesive member 960 may be pressure sensitive adhesive (PSA) members. Any one of the fourth adhesive member 940 and the fifth adhesive member 950 may be omitted.

The first force sensor 510 may have a rectangular planar shape having short sides in the first direction (X-axis direction) and long sides in the second direction (Y-axis direction). The first force sensor 510 may be connected to the display circuit board 310 through the first flexible circuit board 530. The second force sensor 520 may be connected to the display circuit board 310 through the second flexible circuit board 540. The first flexible circuit board 530 and the second flexible circuit board 540 may be flexible printed circuit boards.

Figure 3:
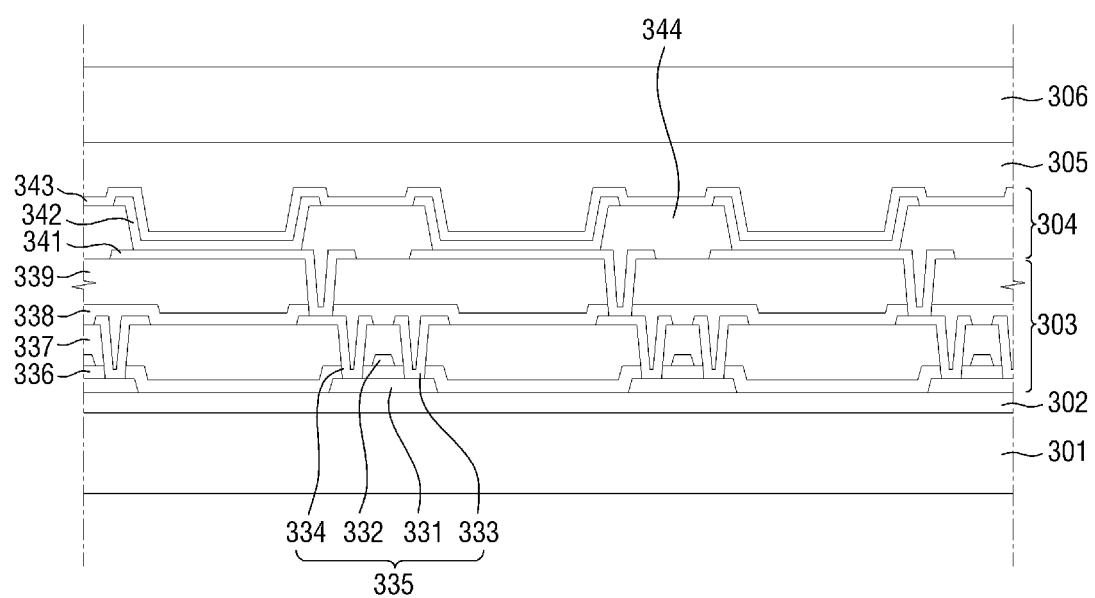
FIG. 3 is a plan view from the bottom showing an example of a display panel attached to a cover window when the display circuit board and third circuit board of FIG. 2 are not bent toward the lower surface of the display panel.

As shown in FIGS. 3 and 4, the force sensing unit 330 for sensing force by driving the first force sensor 510 and the second force sensor 520 may be mounted on the display circuit board 310. In this case, the force sensing unit 330 may be formed as an integrated circuit. The force sensing unit 330 may be integrated with the display driver 320 to form one integrated circuit.

The first flexible circuit board 530 and the second flexible circuit board 540 may be connected to the touch circuit board 210 rather than the display circuit board 310. In this case, the force sensing unit 330 may be mounted on the touch circuit board 210. The force sensing unit 330 may be integrated with the touch driving unit 220 to form one integrated circuit.

The frame 600 may be disposed under the lower panel member 400. The frame 600 may include a synthetic resin, a metal, or both a synthetic resin and a metal.

The waterproofing member 610 may be disposed at the edge of the frame 600. The waterproofing member 610 may be attached to the upper surface of the lower panel member 400 and the lower surface of the frame 600.

The waterproofing member 610 may be disposed adjacent to the first force sensor 510 and may be disposed adjacent to the second force sensor 520. For example, the waterproofing member 610 may be disposed on the outer side of the first force sensor 510 and on the outer side of the second force sensor 520. In this case, the outer side of the first force sensor 510 indicates the right outer side of the first force sensor 510, and the outer side of the second force sensor 520 indicates the left outer side of the second force sensor 520. Since the first force sensor 510 and the second force sensor 520 can be waterproof and dustproof even without the waterproofing member 610, the waterproofing member 610 may be disposed on the inner side of the first force sensor 510 and may be disposed on the inner side of the second force sensor 520. In this case, the inner side of the first force sensor 510 indicates the left outer side of the first force sensor 510, and the inner side of the second force sensor 520 indicates the right outer side of the second force sensor 520.

According to the exemplary embodiment shown in FIGS. 1 and 2, the waterproofing member 610 is disposed adjacent to the first force sensor 510 and is disposed adjacent to the second force sensor 520, so that it is possible to prevent water or dust from penetrating between the display panel 300 and the frame 600 by the waterproofing member 610. That is, a waterproof and dustproof display device 10 may be provided.

Referring to FIG. 2, the frame 600 may provided with a first camera hole CMH1 into which a camera device 720 is inserted, a battery hole BH through which heat is discharged from a battery, and a cable hole CAH through which a second connection cable 314 connected to the display circuit board 310 passes. Specifically, the cable hole CAH may be disposed at the right edge of the frame 600, and in this case, the cable hole CAH may be shrouded by the first force sensor 510 disposed under the lower panel member 400 at the right edge of the display panel 300. Therefore, the first force sensor 510 may include a first concave portion NTH1 formed concavely in a notch shape at one side of the first force sensor 510 in order to expose the cable hole CAH without being shrouded.

Further, the frame 600 is disposed under the lower panel member 400 of the display panel 300, the first force sensor 510, and the second force sensor 520. When pressure is applied to the first force sensor 510 and the second force sensor 520, the frame 600 may support the first force sensor 510 and the second force sensor 520. Accordingly, the first force sensor 510 and the second force sensor 520 may sense the applied force.

The main circuit board 700 may be disposed under the frame 600. The main circuit board 700 may be a printed circuit board or a flexible printed circuit board.

The main circuit board 700 may include a main processor 710, a camera device 720, and a main connector 730. The main processor 710 and the main connector 730 may be disposed on the lower surface of the main circuit board 700, facing the lower cover 900. The camera device 720 may be disposed on both the upper surface and lower surface of the main circuit board 700.

The main processor 710 may control all the functions of the display device 10. For example, the main processor 710 may output image data to the display driving unit 320 of the display circuit board 310 such that the display panel 300 displays an image. Further, the main processor 710 may receive touch data from the touch driving unit 220, determine the touch position of a user, and then execute an application indicated by an icon displayed at the touch position of the user. Further, the main processor 710 may receive force sensing data from the force sensing unit 330, and may execute an application indicated by an icon displayed at the touch position of the user depending on the force sensing data. Further, the main processor 710 may vibrate a vibration generator 901 to control to implement haptic. The main processor 710 may be an application processor, a central processing unit, or a system chip, which includes an integrated circuit.

The camera device 720 processes an image frame such as a still image or a moving image obtained by an image sensor in a camera mode, and outputs the processed image frame to the main processor 710.

The second connection cable 314 having passed through the connector hole CAH of the frame 600 may be connected to the main connector 730 disposed on the lower surface of the main circuit board 700 through the gap GAP between the frame 600 and the main circuit board 700. Thus, the main circuit board 700 can be electrically connected to the display circuit board 310 and the touch circuit board 210.

In addition, the main circuit board 700 may be further provided with a mobile communication module capable of transmitting and receiving a radio signal to/from at least one of a base station, an external terminal, and a server. The radio signal may include various types of data depending on a voice signal, a video call signal, or a text/multimedia message transmission/reception. Further, the main circuit board 700 may be further provided with an acoustic output device capable of outputting sound and a vibration device capable of generating vibration for haptic implementation.

The lower cover 900 may be disposed under the frame 600 and the main circuit board 700. The lower cover 900 may be engaged and fixed to the frame 600. The lower cover 900 may form a lower surface appearance of the display device 10. The lower cover 900 may include plastic and/or metal.

The lower cover may be provided with a second camera hole CMH2 into which the camera device is inserted to protrude outward.

Further, the vibration generator 901 may be disposed on the upper surface of the lower cover 900, and may be connected to the main circuit board 700. Thus, the vibration generator 901 may generate vibration in response to the vibration signal of the main processor 710. The vibration generator 901 may be any one of an eccentric rotating motor (ERM), a linear resonant actuator LRA, and a piezoelectric actuator.

Figure 5:
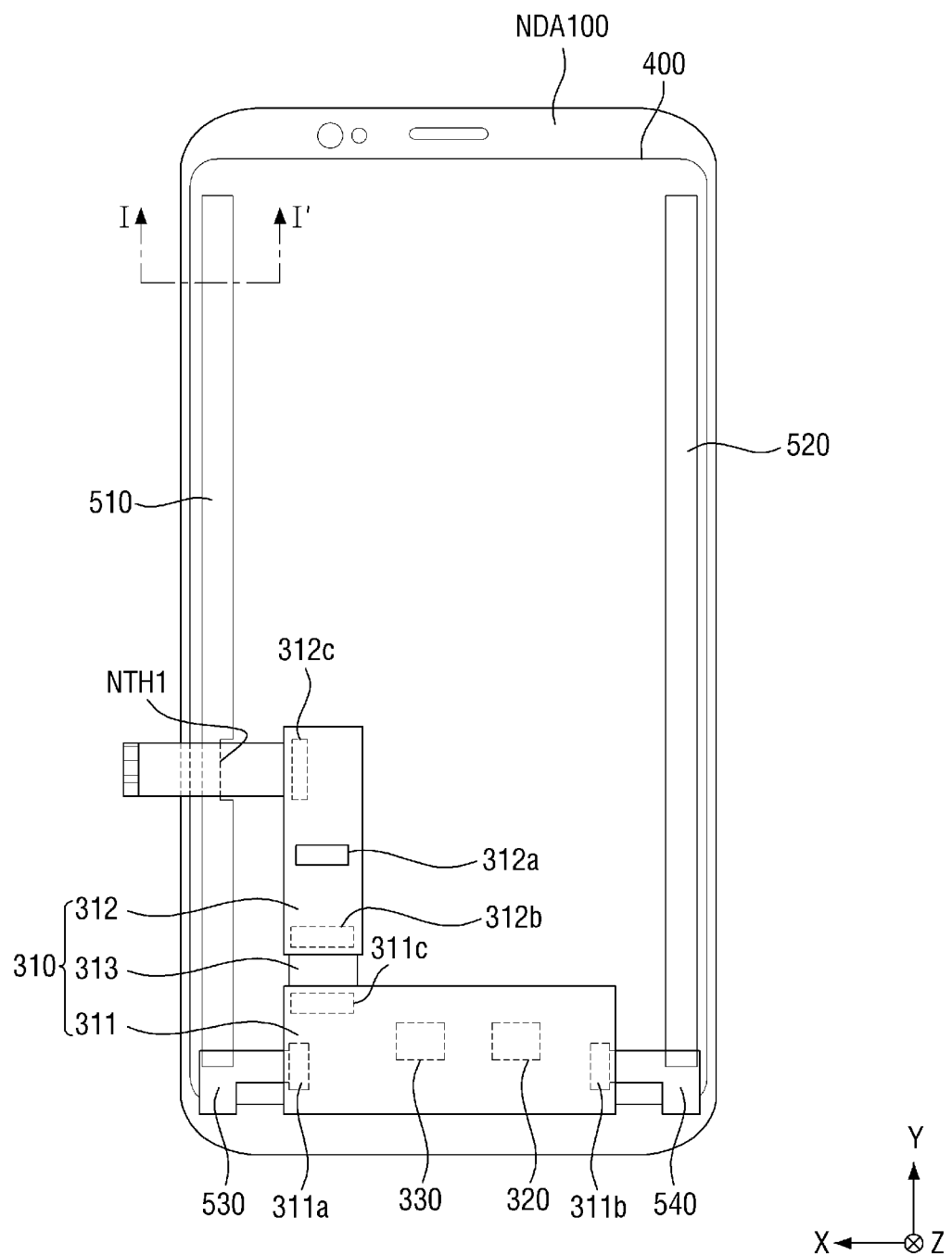
FIG. 5 is plan view showing an example of the frame of FIG. 2.
Figure 6:
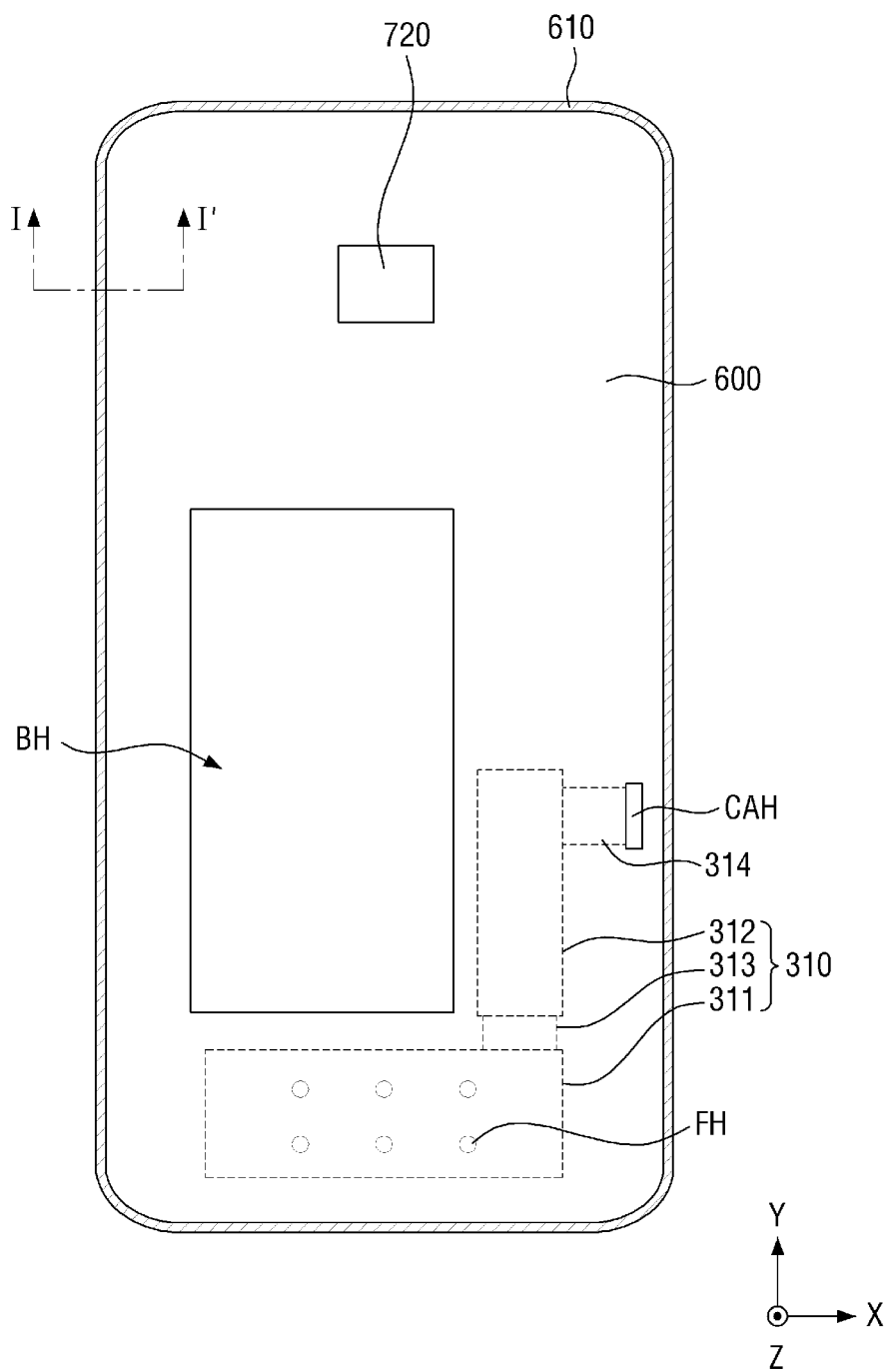
FIG. 6 is a plan view showing an example of the main circuit board of FIG. 2.

FIG. 3 is a plan view from the bottom showing an example of a display panel attached to a cover window when the display circuit board and third circuit board of FIG. 2 are not bent toward the lower surface of the display panel. FIG. 4 is a plan view from the bottom showing an example of a display panel attached to a cover window when the display circuit board and third circuit board of FIG. 2 are bent toward the lower surface of the display panel. FIG. 5 is plan view from the bottom showing an example of the frame of FIG. 2. FIG. 6 is a plan view showing an example of the main circuit board of FIG. 2.

Hereinafter, the connection between the first force sensor 510 and the display circuit board 310 using the first flexible circuit board, the connection between the second force sensor 520 and the display circuit board 310 using the second flexible circuit board, and the connection between the display circuit board 310 and the main circuit board 700 using the second connection cable 314 will be described in detail with reference to FIGS. 3 to 6. Meanwhile, since FIGS. 5 and 6 are plan views from the top while FIGS. 3 and 4 are plan views from the bottom, it should be noted that it is shown in FIGS. 3 and 4 that the left and right of the display device 10 in FIGS. 3 and 4 are reversed. For convenience of explanation, in FIG. 5, the display circuit board 310 is represented by a dotted line, and in FIG. 6, the second connection cable 314 is represented by a dotted line.

Referring to FIGS. 3 to 6, the display circuit board 310 may include a first circuit board 311, a second circuit board 312, and a first connection cable 313.

The first circuit board 311 may be attached to one side of the upper surface or lower surface of the substrate of the display panel 300, and may be bent toward the lower surface of the display panel 300, that is, the lower surface of the lower panel member 400. As shown in FIG. 5, the first circuit board 311 may be fixed to fixing holes FH formed in the frame 600 by fixing members.

The first circuit board 311 may include a display driving unit 320, a force sensing unit 330, a first connector 311a, a second connector 311b, and a third connector 311c. The display driving unit 320, the force sensing unit 330, the first connector 311a, the second connector 311b, and the third connector 311c may be disposed on one surface of the first circuit board 311.

The first connector 311a may be connected to a connector connection portion provided at one end of the first flexible circuit board 530 connected to the first force sensor 510. Thus, the first force sensor 510 may be electrically connected to the force sensing unit 330.

The second connector 311b may be connected to a connector connection portion provided at one end of the second flexible circuit board 540 connected to the second force sensor 520. Thus, the second force sensor 520 may be electrically connected to the force sensing unit 330.

The third connector 311c may be connected to one end of the first connection cable 313 connected to the second circuit board 312. Thus, the display driving unit 320 and the force sensing unit 330 mounted on the first circuit board 311 may be electrically connected to the second circuit board 312 through the first connection cable 313.

The second circuit board 312 may include a touch connector 312a, a first connection connector 312b, and a second connection connector 312c. The first connection connector 312b and the second connection connector 312c may be disposed on one surface of the second circuit board 312, and the touch connector 312a may be disposed on the other surface of the second circuit board 312.

The touch connector 312a may be connected to the touch connection portion provided at one end of the touch circuit board 210. Thus, the touch driving unit 220 may be electrically connected to the second circuit board 312.

The first connection connector 312b may be connected to the other end of the first connection cable 313 connected to the first circuit board 311. Thus, the display driving unit 320 and the force sensing unit 330 mounted on the first circuit board 311 may be electrically connected to the second circuit board 312 through the first connection cable 313.

The second connection connector 312c may be connected to one end of the second connection cable 314 connected to the main connector 730 of the main circuit board 700. Thus, the second circuit board 312 may be electrically connected to the second circuit board 312 through the second connection cable 314.

A connector connection portion 315 may be formed at the other end of the second connection cable 314. The connector connection portion 315 of the second connection cable 314 may extend to the lower surface of the frame 600 through the cable hole CAH of the frame 600 as shown in FIGS. 3, 4 and 5. Since the first force sensor 510 may be provided one side thereof with a first concave portion NTH1 having a notch shape in a region corresponding to the cable hole CAH of the frame 600, the cable hole CAH of the frame 600 may be exposed without being covered by the first force sensor 510.

Further, as shown in FIG. 6, since a gap is formed between the frame 600 and the main circuit board 700, the connector connection portion 315 of the second connection cable 314, having passed through the cable hole CAH, may come out of the gap between the frame 600 and the main circuit board 700, and may extend to the lower surface of the main circuit board 700. Finally, the connector connection portion 315 of the second connection cable 314 may be connected to the main connector 730 disposed on the lower surface of the main circuit board 700.

According to the exemplary embodiment shown in FIGS. 3 to 6, the first concave portion NTH1 having a notch shape is formed in one side of the first force sensor 510 so as not to cover the cable hole CAH of the frame 600. Thus, the second connection cable 314 connected to the display circuit board 310 may extend to the lower surface of the frame 600 through the cable hole CAH, and thus may be connected to the main connector 730 of the main circuit board 700. Thus, the display circuit board 310 and the main circuit board 700 may be stably connected to each other.

The first flexible circuit board 530 electrically connects the first force sensor 510 and the display circuit board 310. One end of the first flexible circuit board 530 may be connected to the first connector 311a of the display circuit board 310. For this purpose, a connector connecting portion may be provided at one end of the first flexible circuit board 530. The other end of the first flexible circuit board 530 may be attached onto the pad portion of the first force sensor 510.

Specifically, the first force sensor 510 may have a rectangular planar shape having short sides in the first direction (X-axis direction) and long sides in the second direction (Y-axis direction). In this case, the pad portion of the first force sensor 510 may be disposed at one end of the first force sensor 510 in the second direction (Y-axis direction). For example, the pad portion of the first force sensor 510 may be disposed at the lower end of the first force sensor 510 in the second direction (Y-axis direction).

As shown in FIG. 3, the first flexible circuit board 530 may be connected to the first connector 311a of the display circuit board 310 in a state in which the display circuit board 310 is unfolded toward the lower side of the display panel 300 without being bent. Accordingly, the first flexible circuit board 530 may have a bent shape such as '⌐'. That is, the first flexible circuit board 530 is formed to be elongated in the second direction (Y-axis direction) from one end of the first force sensor 510 and then bent in the first direction (X-axis direction) in which the display circuit board 310 is disposed.

The second flexible circuit board 540 electrically connects the second force sensor 520 and the display circuit board 310. One end of the second flexible circuit board 540 may be connected to the second connector 311b of the display circuit board 310. For this purpose, a connector connecting portion may be provided at one end of the second flexible circuit board 540. The other end of the second flexible circuit board 540 may be connected to a pad portion provided in the second force sensor 520. The other end of the second flexible circuit board 540 may be attached onto the pad portion of the second force sensor 520.

Specifically, the second force sensor 520 may have a rectangular planar shape having short sides in the first direction (X-axis direction) and long sides in the second direction (Y-axis direction). In this case, the pad portion of the second force sensor 520 may be disposed at one end of the second force sensor 520 in the second direction (Y-axis direction). For example, the pad portion of the second force sensor 520 may be disposed at the lower end of the second force sensor 520 in the second direction (Y-axis direction).

As shown in FIG. 3, the second flexible circuit board 540 may be connected to the second connector 311b of the display circuit board 310 in a state in which the display circuit board 310 is unfolded toward the lower side of the display panel 300 without being bent. Accordingly, the second flexible circuit board 540 may be disposed to be bent in a shape such as '┐'. That is, the second flexible circuit board 540 is formed to be elongated in the second direction (Y-axis direction) from one end of the first force sensor 510 and then bent in a direction opposite to the first direction (X-axis direction) in which the display circuit board 310 is disposed.

The display circuit board 310, the first flexible circuit board 530, and the second flexible circuit board 540 may be bent at least once. The first flexible circuit board 530 is connected to the first connector 311a of the display circuit board 310, the second flexible circuit board 540 is connected to the second connector 311b of the display circuit board 310, and then the display circuit board 310, the first flexible circuit board 530, and the second flexible circuit board 540 are bent toward the lower portion of the display panel 300, that is, the lower portion of the lower panel member 400 and fixed thereto.

In this case, since one end of the first flexible circuit board 530 is attached to the first pad portion PAD of the first force sensor 510 but the first flexible circuit board 530 is bent toward the lower portion of the lower panel member 400, the other end of the first flexible circuit board 530 may be disposed under the lower panel member 400. Further, since one end of the second flexible circuit board 540 is attached to the second pad portion of the second force sensor 520 but the second flexible circuit board 540 is bent toward the lower portion of the lower panel member 400, the other end of the flexible circuit board 540 may be disposed under the lower panel member 400. Further, since one side of the display circuit board 310 is attached to the upper surface or lower surface of the display panel 300 but the display circuit board 310 is bent toward the lower side of the lower panel member 400, the other side of the display circuit board 310 may be disposed under the lower panel member 400.

According to the exemplary embodiment shown in FIGS. 3 to 6, the first force sensor 510 may be connected to the display circuit board 310 through the first flexible circuit board 530, and the second force sensor 520 may be connected to the display circuit board 310 through the second flexible circuit board 540. Therefore, the first force sensor 510 and the second force sensor 520 may be stably and electrically connected to the force sensing unit 330 of the display circuit board 310.

FIG. 8 is a plan view showing a first force sensor and first bumps according to an exemplary embodiment.

Referring to FIG. 8, the first force sensor 510 may have a rectangular planar shape having short sides in the first direction (X-axis direction) and long sides in the second direction (Y-axis direction). However, the planar shape of the first force sensor 510 is not limited thereto, and may vary depending on the applied position.

The first force sensor 510 includes a plurality of force sensing cells CE1 to CE8. It is illustrated in FIG. 8 that the first force sensor 510 includes eight force sensing cells CE1 to CE8, but the number of force sensing cells is not limited thereto.

Each of the force sensing cells CE1 to CE8 may independently sense the pressure at the corresponding position. Although it is illustrated in FIG. 8 that the force sensing cells CE1 to CE8 are arranged in one row, the present invention is not limited thereto. The force sensing cells CE1 to CE8c may be arranged in a plurality of rows, if necessary. The respective force sensing CE1 to CE8c may be arranged to be spaced apart from each other at predetermined intervals as shown in FIG. 8, or may be arranged continuously.

Figure 13:
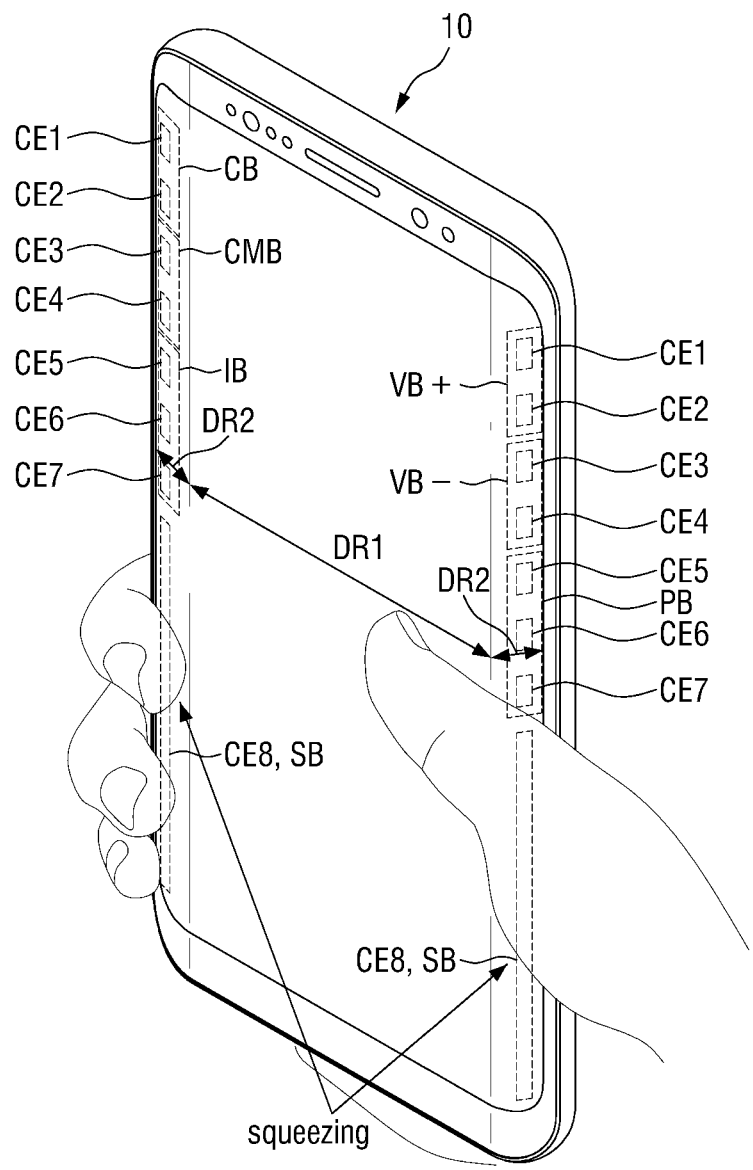

The force sensing cells CE1 to CE8 may have different shapes and areas depending on the application. For example, as shown in FIG. 13, the first to seventh force sensing cells CE1 to CE7 may be used as physical buttons such as volume control buttons VB+ and VB− or power buttons PB disposed on the edge of one side of the display device 10. As shown in FIG. 13, the eighth force sensing cell CE8 may be used as a button SQB for sensing the squeezing force of a user. In this case, the eighth force sensing cell CE8 may be formed to have a larger area than each of the first to seventh force sensing cells CE1 to CE7. The eighth force sensing cell CE8 may be formed longer than each of the first to seventh force sensing cells CE1 to CE7 in the length direction (Y-axis direction) of the first force sensor 510.

Although it is illustrated in FIG. 8 that the first to seventh force sensing cells CE1 to CE7 used as physical buttons are formed to have the same area, the present invention is not limited thereto. That is, the areas of the first to seventh force sensing cells CE1 to CE7 may be different from each other. Or, the areas of some of the first to seventh force sensing cells CE1 to CE7 are equal to each other and the areas of the others of the first to seventh force sensing cells CE1 to CE7 are equal to each other, but the area of each of some of the first to seventh force sensing cells CE1 to CE7 and the area of each of the others of the first to seventh force sensing cells CE1 to CE7 may be different from each other.

The first bumps 550 may be disposed on the first to eighth force sensing cells CE1 to CE8 to overlap the first to eighth force sensing cells CE1 to CE8. The first bumps 550 may serve to press the first to eighth force sensing cells CE1 to CE8 according to the force of the user. Therefore, the force of the user may be sensed by the first to eighth force sensing cells CE1 to CE8.

In order to increase the force applied to the first to eighth force sensing cells CE1 to CE8 by the first bumps 550, each of the first bumps 550 may be formed to have a smaller area than each of the first to eighth force sensing cells CE1 to CE8. Each of the first bumps 550 may be formed to have a smaller area than the force sensing layer (PSL) of each of the first to eighth force sensing cells CE1 to CE8.

The area of the first bump 550 may be proportional to the area of the force sensing cell. For example, as shown in FIG. 8, when the area of the eighth force sensing cell CE8 is larger than the area of each of the first to seventh force sensing cells CE1 to CE7, the area of the first bump 550 overlapping the eighth force sensing cell CE8 may be larger than the area of each of the first bumps 550 overlapping the first to seventh force sensing cells CE1 to CE7.

In order not to cover the cable hole CAH of the frame 600, a first concave portion NTH1 having a notch shape may be formed in an area corresponding to the cable hole CAH of the frame 600 in the first force sensor 510.

The first force sensor 510 further includes a pad portion PAD including a driving line TL connected to the plurality of force sensing cells CE1 to CE8 and a plurality of pads connected to the sensing lines RL1 to RL8. The pad portion PAD may be disposed at one end of the first force sensor 510 in the second direction (Y-axis direction).

Meanwhile, the second force sensor 520 and the second bumps are different from the first force sensor 510 and the first bumps 550 shown in FIG. 8 only in that the second force sensor 520 does not include a concave portion NTH1. Therefore, a detailed description of the second force sensor 520 and the second bumps will be omitted.

Figure 9:
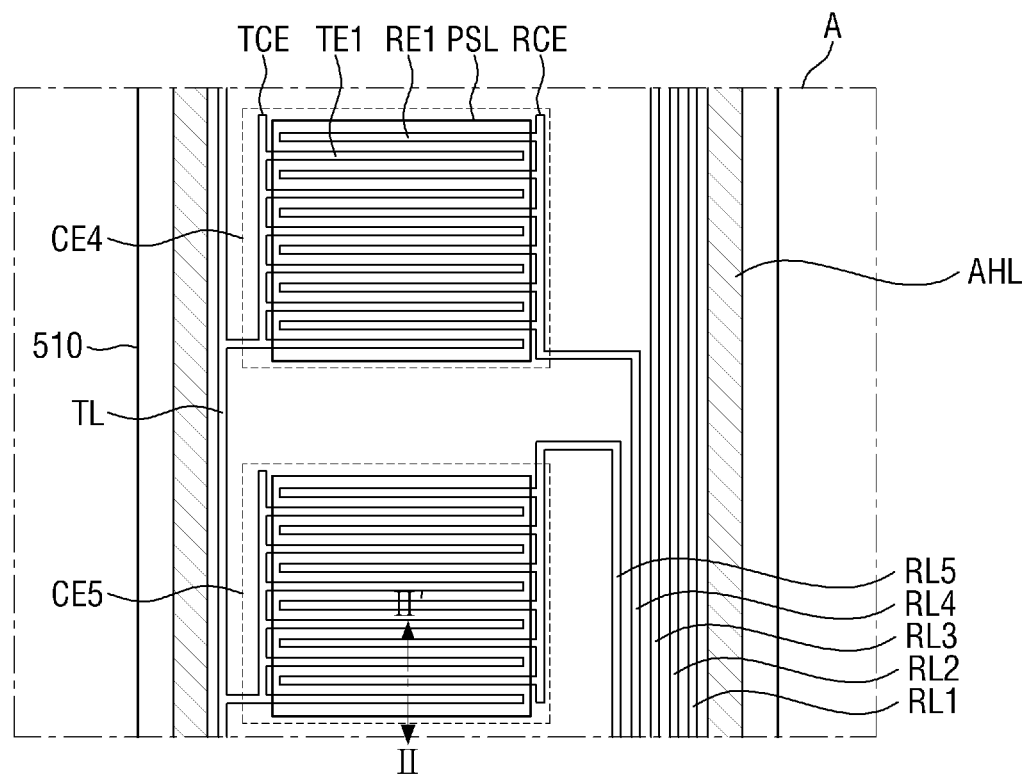
FIG. 9 is a plan view specifically showing the area A of FIG. 8.
Figure 10:
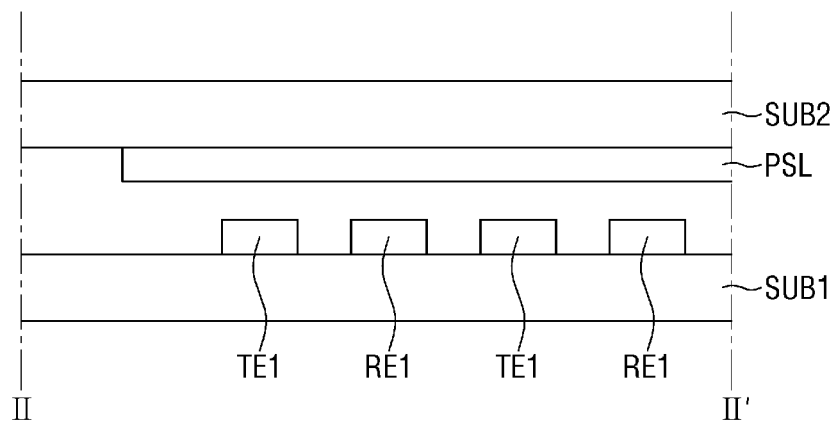
FIG. 10 is a cross-sectional view taken along the line II-II' of FIG. 9.
Figure 10:
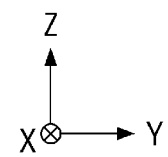

FIG. 9 is a plan view specifically showing the area A of FIG. 8. FIG. 10 is a cross-sectional view taken along the line II-II' of FIG. 9.

Referring to FIGS. 9 and 10, the first force sensor 510 includes a first substrate SUB1, a second substrate SUB2, a driving line TL, a plurality of sensing lines RL1 to RL5, and first to eighth force sensing cells CE1 to CE8.

For convenience of explanation, FIGS. 9 and 10 show the fourth force sensing cell CE4, the fifth force sensing cell CE5, and the first to fifth sensing lines RL1 to RL5 connected to the first to fifth force sensing cells CE to CE5. Further, for convenience of explanation, FIG. 9 omits the second substrate SUB2.

The first substrate SUB1 and the second substrate SUB2 are disposed to face each other. Each of the first substrate SUB1 and the second substrate SUB2 may include polyethylene, polyimide, polycarbonate, polsulfone, polyacrylate, polystyrene, polyvinyl chloride, polyvinyl alcohol, polynorbonene, or polyester. In an exemplary embodiment, each of the first substrate SUB1 and the second substrate SUB2 may be formed of a polyethylene terephthalate (PET) film or a polyimide film.

Force sensing cells CE1 to CE8 are arranged between the first substrate SUB1 and the second substrate SUB2. A driving line TL, sensing lines RL1 to RL5, a driving pad, and sensing pads are arranged on one surface of the first substrate SUB1 facing the second substrate SUB2.

Each of the force sensing cells CE1 to CE8 may be connected to at least one driving line and at least one sensing line. For example, the force sensing cells CE1 to CE8 may be commonly connected to one driving line TL, whereas they may be connected to the corresponding one of the sensing lines RL1 to RL5. As shown in FIG. 9, the fourth force sensing cell CE4 may be connected to the driving line TL and the fourth sensing line RL4, and the fifth force sensing cell CE5 may be connected to the driving line TL and the fifth sensing line RL5. The driving line TL may be connected to the driving pad TP, and the sensing lines RL1 to RL5 may be connected to the corresponding sensing pads.

The pad portion may be provided with a driving pad and sensing pads. The driving pad may be connected to the driving lead lines of the first flexible circuit board 530, and the sensing pads may be connected to the corresponding sensing lead lines of the first flexible circuit board 530. Therefore, the first flexible circuit board 530 is connected to the display circuit board 310, so that the first flexible circuit board 530 may be electrically connected to the force sensing unit 330 mounted on the display circuit board 310. The force sensing unit 330 applies a driving voltage to the driving line through the driving lead line of the first flexible circuit board 530 and the driving pad of the first force sensor 510, and senses current values or voltage values from the sensing lines RL1 to RL5 through the sensing lines RL1 to RL5 connected to the sensing pads, thereby sensing the force applied to the force sensing cells CE1 to CE8.

The first force sensor 510 may further include a bonding layer AHL disposed between the first substrate SUB1 and the second substrate SUB2 to bond the first substrate SUB1 and the second substrate SUB2 to each other. The bonding layer AHL may be a pressure-sensitive adhesive layer or an adhesive layer. The bonding layer AHL may be disposed along the periphery of the first substrate SUB1 and the second substrate SUB2. In an exemplary embodiment, the bonding layer AHL may serve to encapsulate the inside of the force sensor 510 by completely surrounding the edges of the first substrate SUB1 and the second substrate SUB2. The first force sensor 510 may be waterproof and dustproof due to the bonding layer AHL.

Moreover, the bonding layer AHL may serve as a spacer that maintains a constant distance between the first substrate SUB1 and the second substrate SUB2. The bonding layer AHL may not be formed in the pad portion PAD, and may not overlap the driving line TL, the sensing lines RL1 to RLp, the force sensing cells CE1 to CEp, the driving pad TP, and the sensing pads RP1 to RPp, but the present invention is not limited thereto. That is, the bonding layer AHL may be disposed to overlap the driving line TL, the sensing lines RL1 to RLp, the force sensing cells CE1 to CEp, the driving pad TP, and the sensing pads RP1 to RPp.

The bonding layer AHL may be first attached to one surface of the first substrate SUB1 or one surface of the second substrate SUB2, and then attached to one surface of the other substrate in the process of attaching the first substrate SUB1 to the second substrate SUB2. As another example, the respective bonding layers AHL may be provided on one surface of the first substrate SUB1 and one surface of the second substrate SUB2, and the bonding layer of the first substrate SUB1 and the bonding layer AHL of the second substrate SUB2 may be attached to each other in the process of attaching the first substrate SUB1 to the second substrate SUB2.

As shown in FIGS. 9 and 10, each of the force sensing cells CE1 to CE8 includes a driving connection electrode TCE, a sensing connection electrode RCE, driving electrodes TE1, sensing electrodes RE1, and a force sensing layer PSL.

The driving connection electrode TCE, the sensing connection electrode RCE, the driving electrodes TE1, and the sensing electrodes RE1 may be disposed on the first substrate SUB1 facing the second substrate SUB2.

The driving connection electrode TCE is connected to the driving line TL and the driving electrode TE1. Specifically, the driving connection electrode TCE is connected to the driving line TL at one end in the longitudinal direction (Y-axis direction). The driving electrodes TE1 may be branched in the width direction (X axis direction) of the driving connection electrode TCE.

The sensing connection electrode RCE is connected to the sensing electrodes RE1 and any one of the sensing lines RL1 to RL8. Specifically, the sensing connection electrode TCE is connected to any one of the sensing lines RL1 to RL8 at one end in the length direction (Y-axis direction). The sensing electrodes RE1 may be branched in the width direction (X-axis direction) of the sensing connection electrode RCE.

The driving electrodes TE1 and the sensing electrodes RE1 may be disposed on the same layer. The driving electrodes TE1 and the sensing electrodes RE1 may be made of the same material. For example, the driving electrodes TE1 and the sensing electrodes RE1 may include a conductive material such as silver (Ag) or copper (Cu). The driving electrodes TE1 and the sensing electrodes RE1 may be formed on the first substrate SUB1 by a screen printing method.

The driving electrodes TE1 and the sensing electrodes RE1 are disposed adjacent to each other, but are not connected to each other. The driving electrodes TE1 and the sensing electrodes RE11 may be arranged in parallel with each other. The driving electrodes TE1 and the sensing electrodes RE1 may be alternately arranged in the length direction (Y-axis direction). That is, the driving electrodes TE1 and the sensing electrodes RE11 may be repeatedly arranged in the length direction (Y-axis direction) in order of the driving electrode TE1, the sensing electrode RE1, the driving electrode TE1, and the sensing electrode RE1.

The force sensing layer PSL is disposed on one surface of the second substrate SUB2 facing the first substrate SUB1. The force sensing layer PSL may be disposed to overlap the driving electrodes TE1 and the sensing electrodes RE1.

The force sensing layer PSL may include a pressure-sensitive material and a polymer resin in which the pressure-sensitive material is provided. The pressure-sensitive material may include fine metal particles (or metal nanoparticles) of nickel, aluminum, titanium, tin, or copper. For example, the first force sensing layer PSL may be a quantum tunneling composite (QTC).

When force is not applied to the second substrate SUB2 in the height direction (Z-axis direction) of the first force sensor 510, as shown in FIG. 10, gaps exist between the force sensing layer PSL and the driving electrodes TE1 and between the force sensing layer PSL and the sensing electrodes RE1. That is, when force is not applied to the second substrate SUB2, the force sensing layer PSL is spaced apart from the driving electrodes TE1 and the sensing electrodes RE1.

When force is applied to the second substrate SUB2 in the height direction (Z-axis direction) of the first force sensor 510, the force sensing layer PSL may be brought into contact with the driving electrodes TE1 and the sensing electrodes RE1. In this case, at least one of the driving electrode TE1 and at least one of the sensing electrodes RE1 may be physically connected through the force sensing layer PSL, and the force sensing layer PSL may act as an electrical resistance.

Figure 11:
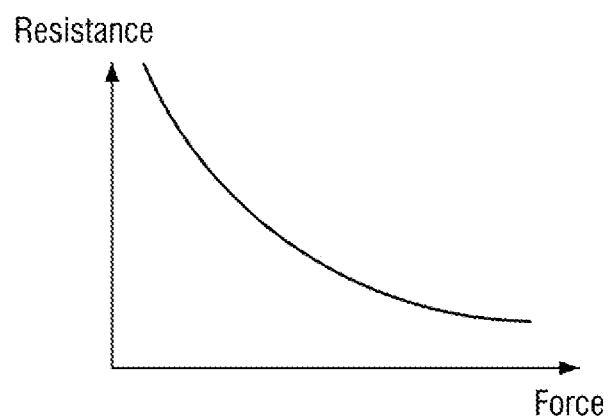
FIG. 11 is a graph showing the electrical resistance of a force sensing layer with respect to force.

Accordingly, according to the exemplary embodiment shown in FIGS. 9 and 10, since the contact area of the force sensing layer PSL with the driving electrodes TE1 and the sensing electrode RE1 is changed depending on the force applied to the force sensing cells of the first force sensor 510, the resistance value of the sensing line electrically connected to the sensing electrodes RE1 may be changed. For example, as shown in FIG. 11, the higher the force applied to the force sensing cells of the second force sensor 520, the lower the resistance value of the sensing line. The force sensing unit 330 senses a change in a current value or a voltage value from the sensing lines RL1 to RL8, thereby sensing the force input by a user's hand. Therefore, the first force sensor 510 may be used as an input device for sensing a user's input.

Meanwhile, since the second force sensor 520 is substantially the same as the first force sensor 510 shown in FIGS. 9 and 10, a detailed description of the second force sensor 520 will be omitted.

Figure 12:
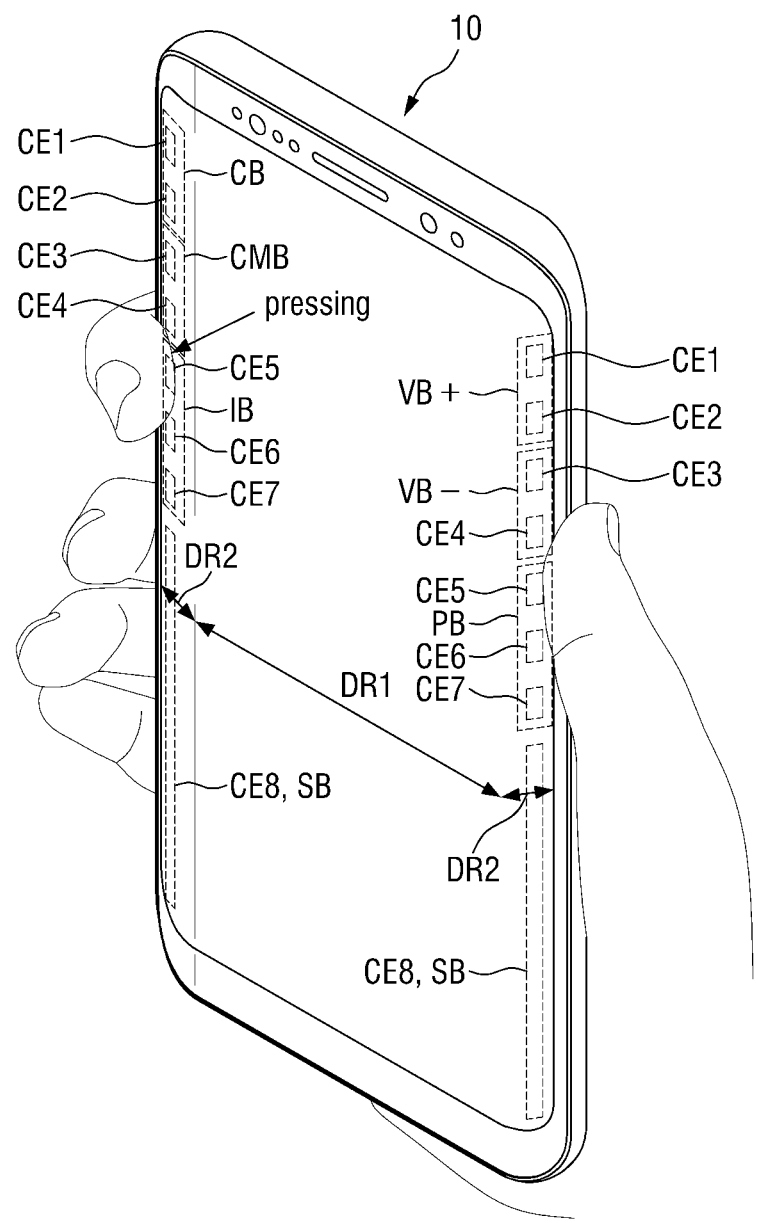
FIGS. 12 and 13 are exemplary views showing a display device utilizing first and second force sensors as physical buttons according to an exemplary embodiment.

FIGS. 12 and 13 are exemplary views showing a display device utilizing first and second force sensors as physical buttons according to an exemplary embodiment.

FIGS. 11 and 12 show the first to eighth force sensing cells CE1 to CE8 of the first force sensor 510 and the second force sensor 520 disposed in the second areas DR2 of the display device 10. The first vibration generator 810 may be disposed adjacent to the first to fourth force sensing cells CE1, CE2, CE3, and CE4 of the first force sensor 510 disposed on the right curved portion of the display device 10, and the third vibration generator 830 may be disposed adjacent to the fifth to eighth force sensing cells CE5, CE6, CE7, and CE8. Further, the second vibration generator 820 may be disposed adjacent to the first to fourth force sensing cells CE1, CE2, CE3, and CE4 of the second force sensor 520 disposed on the left curved portion of the display device 10, and the fourth vibration generator 840 may be disposed adjacent to the fifth to eighth force sensing cells CE5, CE6, CE7, and CE8.

It is shown in FIG. 12 that a user presses the fifth force sensing cell CE5 of the left curved portion corresponding to the second area DR2 of the display device 10 with a forefinger in a state in which the user grips the display device 10 by hand. It is shown in FIG. 13 that a user squeezes the eighth force sensing cell CE8 of the left curved portion corresponding to the second area DR2 of the eighth force sensing cell CE8 of the display device 10 with a middle finger, a ring finger and a little finger in a state in which the user grips the display device 10 by hand, and that the user squeezes the eighth force sensing cell CE8 of the right curved portion corresponding to the second area DR2 of the eighth force sensing cell CE8 of the display device 10 with a palm in this state.

Referring to FIGS. 12 and 13, the first force sensor 510 and the second force sensor 520 may be used instead of the physical buttons of the display device 10. Specifically, when force is applied to the first to eighth force sensing cells CE1 to CE8 of the first force sensor 510 formed on the right curved portion of the display device 10 and the first to eighth force sensing cells CE1 to CE8 of the second force sensor 520 formed on the left curved portion of the display device 10, predetermined application or operation may be executed.

For example, among the first to eighth force sensing cells CE1 to CE8 of the first force sensor 510 formed on the right curved portion of the display device 10, the first force sensing cell CE1 and the second force sensing cell CE2 may be used as volume up buttons VB+ that are pressed by a user so as to increase the volume of the display device 10, the third force sensing cell CE3 and the fourth force sensing cell CE4 may be used as volume down buttons VB− that are pressed by the user so as to increase the volume of the display device 10, and the fifth force sensing cell CE5, the sixth force sensing cell CE6, and the seventh force sensing cell CE7 may be used as power buttons PWB pressed by the user so as to turn a power off.

When pressure is sensed from the first force sensing cell CE1 and the second force sensing cell CE2 formed on the right curved portion of the display device 10, the main processor 710 may control the volume of a speaker of the display device 10 to increase. When force is sensed from the first force sensing cell CE1 and the second force sensing cell CE2 formed on the right curved portion of the display device 10, the main processor 710 may control the volume of a speaker of the display device 10 to increase. Further, when force is sensed from the third force sensing cell CE3 and the fourth force sensing cell CE4 formed on the right curved portion of the display device 10, the main processor 710 may control the volume of the speaker of the display device 10 to increase. Further, when force is sensed from the fifth force sensing cell CE5, the sixth force sensing cell CE6, and the seventh force sensing cell CE7 formed on the right curved portion of the display device 10, the main processor 710 may turn off a screen of the display device, or may output a screen which can select the turning off of the display device 10.

Further, among the first to eighth force sensing cells CE1 to CE8 formed on the left curved portion of the display device 10, the first force sensing cell CE1 and the second force sensing cell CE2 may be used as call buttons CB that are pressed by a user so as to execute a call application, the third force sensing cell CE3 and the fourth force sensing cell CE4 may be used as camera buttons CMB that are pressed by the user so as to execute a camera application, and the fifth force sensing cell CE5, the sixth force sensing cell CE6, and the seventh force sensing cell CE7 may be used as internet buttons D3 pressed by the user so as to execute an internet application.

In this case, when pressure is sensed from the first force sensing cell CE1 and the second force sensing cell CE2 formed on the right curved portion of the display device 10, the main processor 710 may control a call application to be executed. Further, when force is sensed from the third force sensing cell CE3 and the fourth force sensing cell CE4 formed on the right curved portion of the display device 10, the main processor 710 may control a camera application to be executed. Further, when force is sensed from the fifth force sensing cell CE5, the sixth force sensing cell CE6, and the seventh force sensing cell CE7 formed on the left curved portion of the display device 10, the main processor 710 may control an internet application to be executed.

Since the exemplary embodiment shown in FIG. 12 is only one example, the present invention is not limited thereto. That is, when force is applied to the first to seventh force sensing cells CE1 to CE7 of the first force sensor 510 located on the right curved portion of the display device 10 and the first to seventh force sensing cells CE1 to CE7 of the second force sensor 520 located on the left curved portion of the display device 10, the display device may include the aforementioned functions or may execute various functions other than these functions. Further, the display device 10 may be programmed such that different operations from each other are executed for each of the first to seventh force sensing cells CE1 to CE7 of the first force sensor 510 located on the right curved portion of the display device 10 and the first to seventh force sensing cells CE1 to CE7 of the second force sensor 520 located on the left curved portion of the display device 10.

Further, each of the eighth force sensing cells CE8 respectively formed on the right curved portion and right curved portion of the display device 10 may be used as a squeezing sensing button SB. The squeezing force applied to the eighth force sensing cell CE8 may be greater than the force applied to the first to seventh force sensing cells CE1 to CE7. When the squeezing force is sensed from the eighth force sensing cell CE8 formed on each of the left curved portion and the right curved portion, the main processor 710 may control a predetermined application or operation to be executed. For example, when the squeezing force is sensed from the eighth force sensing cell CE8 formed on each of the left curved portion and the right curved portion, the main processor 710 may control the display device 10 to be turned on in a sleep mode.

According to the exemplary embodiment shown in FIGS. 12 and 13, the first force sensor 510 and the second force sensor 520 are disposed in the second areas DR2 corresponding to the curved portions of the display device 10, so that the first force sensor 510 and the second force sensor 520 may be used as physical buttons such as volume control buttons, power buttons, call buttons, camera buttons, internet buttons, and squeezing sensing buttons.

Further, when force is applied to the first force sensor 510 and the second force sensor 520, the vibration generator 901 may be controlled to vibrate. In this case, the vibration of the vibration generator 901 when force is applied to the first force sensor 510 may be different from the vibration of the vibration generator 901 when force is applied to the second force sensor 520. Further, the vibration of the vibration generator 901 may be changed depending on the application of force to any one of the first to eighth force sensing cells CE1 to CE8 of the first force sensor 510 and the first to eighth force sensing cells CE1 to CE8 of the second force sensor 520. The vibration of the vibration generator 901 may be adjusted by adjusting the vibration frequency, vibration displacement, and/or vibration period of the vibration generator.

According to the exemplary embodiment shown in FIGS. 12 and 13, when force is sensed by the first to eighth force sensing cells CE1 to CE8 of the first force sensor 510 and the first to eighth force sensing cells CE1 to CE8 of the second force sensor 520, the vibration generator 901 vibrates, thereby providing various tactile sensations, that is, haptic to the user.

Figure 15:
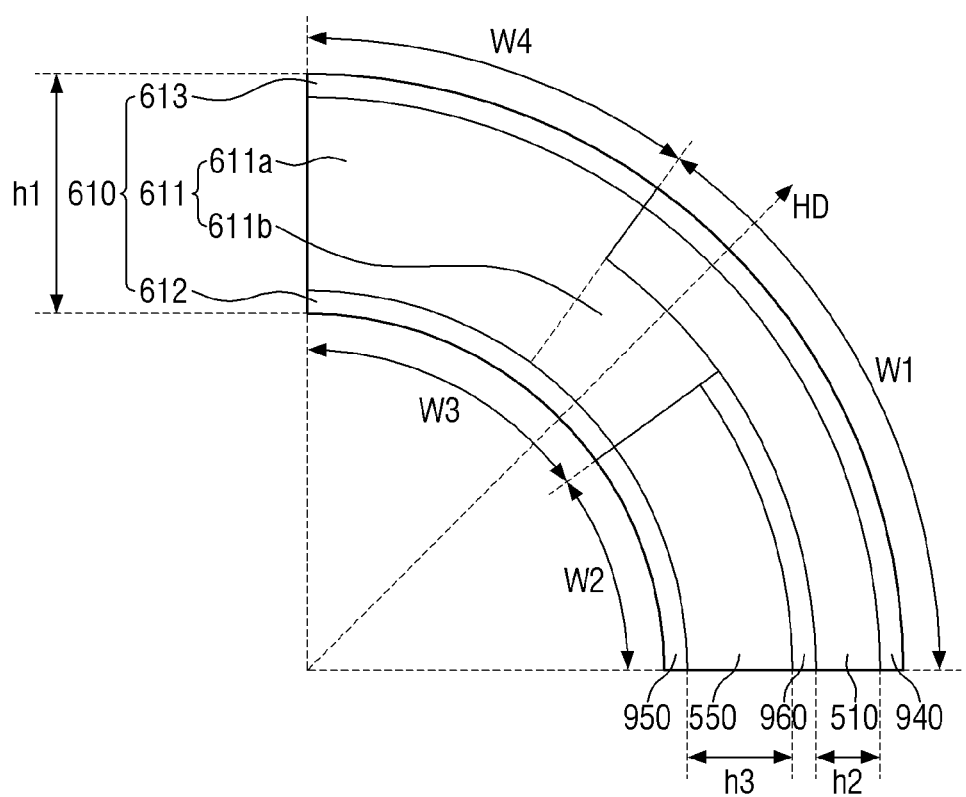
FIG. 15 is an enlarged view showing an example of the area B of FIG. 14.

FIG. 14 is a cross-sectional view showing an example of I-I' of FIGS. 3 and 4. FIG. 15 is an enlarged view showing an example of the area B of FIG. 14.

Referring to FIG. 14, the cover window 100, the touch sensing unit 200, the display panel 300, the lower panel member 400, and the frame 600 may be formed to be flat in the first area DR1, and may be formed to be curved in the second area DR2.

Referring to FIG. 15, the first force sensor 510 and the waterproofing member 610 may be disposed in the second area DR2. The first force sensor 510 and the waterproofing member 610 are disposed adjacent to each other. That is, the first force sensor 510 and the waterproofing member 610 may be disposed adjacent to each other in the first direction (X-axis direction).

The waterproofing member 610 may be disposed on the inner side of the first force sensor 510. That is, the waterproofing member 610 may be disposed on one side surface of the first force sensor 510, and one side surface of the first force sensor 510 may be disposed close to the first area DR1 of the display panel 300 as compared with other side surfaces of the first force sensor 510. For example, when the first force sensor 510 is disposed at the right edge of the display panel 300, the inner side of the first force sensor 510 indicates the left outer side. The waterproofing member 610 may be disposed on the right side surface of the first force sensor 510.

First bumps 550 may be disposed under the first force sensor 510. In this case, the upper surface of the first force sensor 510 may be attached to the lower surface of the lower panel member 400 through a fourth adhesive member 940, and the lower surface of each of the first bumps 550 may be attached to the upper surface of the frame 600 through a fifth adhesive member 950. Further, the lower surface of the first force sensor 510 may be attached to the upper surface of each of the first bumps 550 through the sixth adhesive member 960. The fourth adhesive member 940, the fifth adhesive member 950, and the sixth adhesive member 960 may be pressure-sensitive adhesive (PSA) members. Any one of the fourth adhesive member 940 and the fifth adhesive member 950 may be omitted.

The waterproofing member 610 may be attached to the lower surface of the lower panel member 400 and the upper surface of the frame 600. For this purpose, as shown in FIGS. 14 and 15, the waterproofing member 610 may include a base film 611, a first adhesive film 612 disposed on one surface of the base film 611, and a second adhesive film 613 disposed on the other surface of the base film 611. The base film 611 may be a polyethylene terephthalate (PET) film, a polyethylene terephthalate (PET) film and a cushion layer, or a polyethylene foam (PE-foam). The first adhesive film 612 and the second adhesive film 613 may be pressure-sensitive adhesive films. The first adhesive film 612 may be adhered to the upper surface of the frame 600, and the second adhesive film 613 may be adhered to the lower surface of the lower panel member 400.

As shown in FIG. 15, when the height h1 of the waterproofing member 610 is lower than the sum of the height h2 of the first force sensor 510 and the height h3 of the first bump 550, the first force sensor 510 may be damaged by the force for attaching the waterproofing member 610 to the lower surface of the lower panel member 400 and the upper surface of the frame 600. Therefore, it is preferred that the height h1 of the waterproofing member 610 is higher than the sum of the height h2 of the first force sensor 510 and the height h3 of the first bump 550. However, when the height h1 of the waterproofing member 610 is much higher than the sum of the height h2 of the first force sensor 510 and the height h3 of the first bump 550, force may not be sensed by the first force sensor 510. Therefore, preferably, the height h1 of the waterproofing member 610 is previously determined, considering that the first force sensor 510 is damaged by the force for attaching the waterproofing member 610 and considering whether or not force is sensed by the first force sensor 510 after attachment of the waterproofing member 610.

Further, in order for the first bump 550 to properly press the force sensing cells CE1 to CE8c of the first force sensor 510, it is preferred that the height h3 of the first bump 550 is higher than the height h2 of the first force sensor 510.

A part of the first force sensor 510 and a part of the waterproofing member 610 may be disposed to overlap each other in the height direction HD of the display panel 300. The height direction HD of the display panel 300 indicates the Z axis direction in the first area DR1, but may indicate the extending direction of radius of curvature (RC) of the second area DR2 of the display panel 300 in the second area DR2 that is curved portion as shown in FIGS. 14 and 15. For this purpose, the width W1 of the first force sensor 510 in the first direction (X-axis direction) may be larger than the width W2 of the first bump 550 in the first direction (X-axis direction). Further, the width W3 of the lower surface of the waterproof member 610 in the first direction (X-axis direction) may be larger than the width W4 of the upper surface of the waterproofing member 610 in the first direction (X-axis direction).

In order for a part of the first force sensor 510 and a part of the waterproofing member 610 to be disposed to overlap each other in the height direction HD of the display panel 300, the waterproofing member 610 may be formed in a "⌐" shape. In this case, the base film 611 of the waterproofing member 610 may include a main portion 611a and a protrusion portion 611b protruding from the main portion 611a. The main portion 611a is a region where the second adhesive film 613 is formed on the upper surface thereof, and the protrusion portion 611b is a region overlapping a part of the first force sensor 510 in the height direction HD of the display panel 300. The protrusion portion 611b may be disposed on a part of the lower surface of the first force sensor 510 and on one side surface of the first bump 550.

Figure 16:
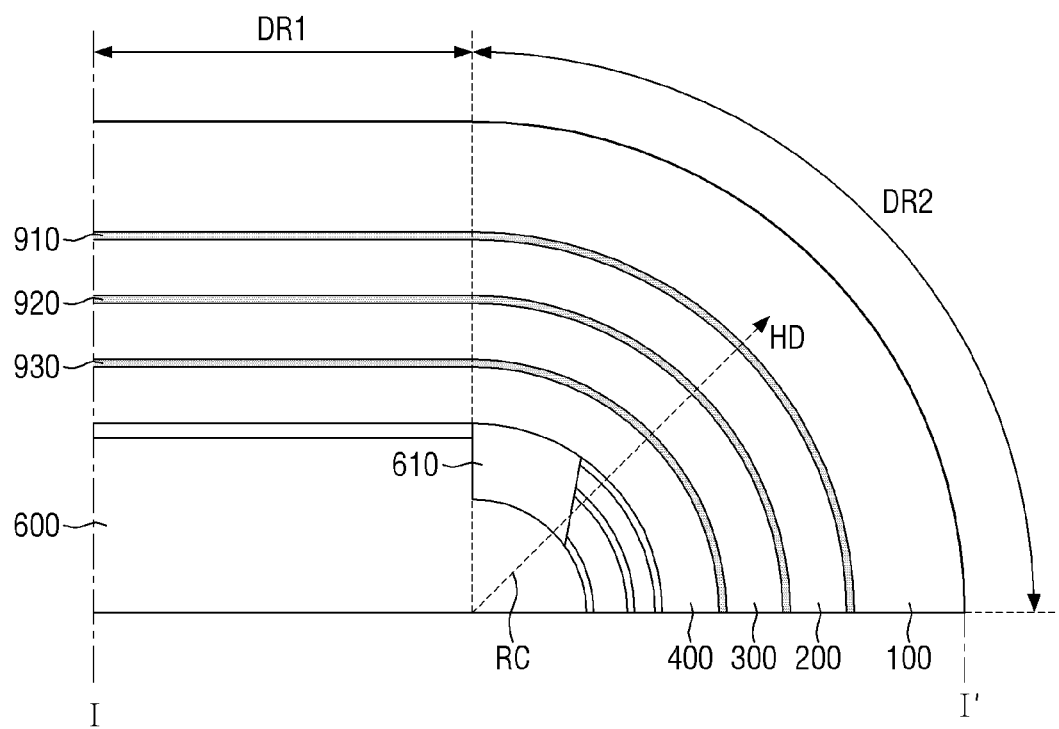
FIG. 16 is a cross-sectional view showing another example of I-I' of FIGS. 3 and 4.
Figure 17:
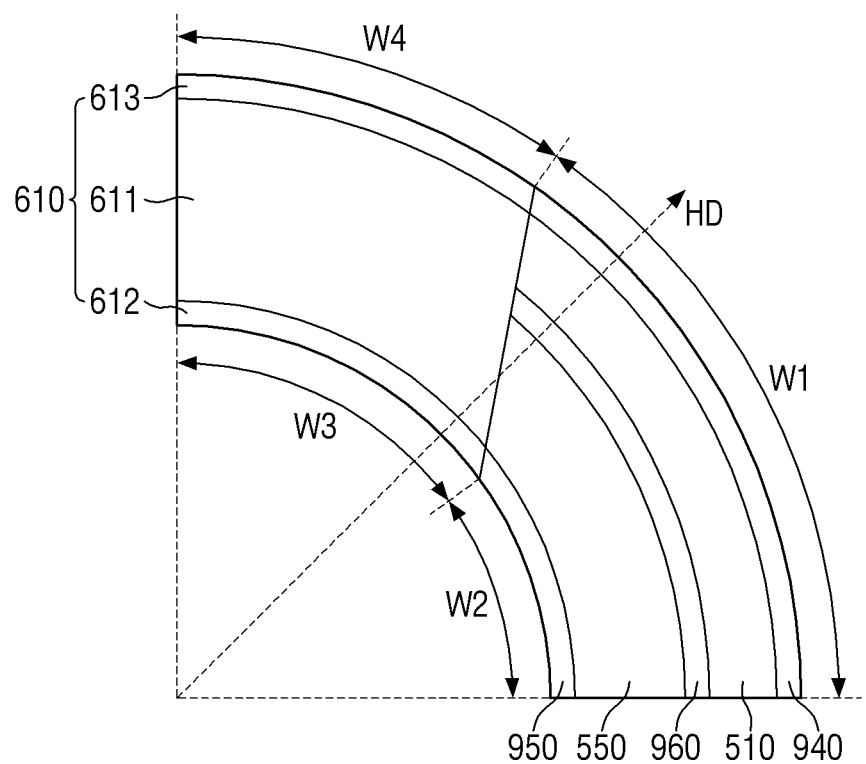
FIG. 17 is an enlarged view showing another example of the area B of FIG. 16.

Further, in order for a part of the first force sensor 510 and a part of the waterproofing member 610 to be disposed to overlap each other, as shown in FIGS. 16 and 17, one side surface of the first force sensor 510 facing the waterproofing member 610 and one side surface of each of the first bumps 550 may be formed obliquely with respect to the height direction HD of the display panel 300, and one side surface of the waterproofing member 610 facing the first force sensor 510 and the first bumps 550 may be formed obliquely with respect to the height direction HD of the display panel 300.

According to the exemplary embodiment shown in FIGS. 14, 15, 16, and 17, since a part of the first force sensor 510 and a part of the waterproof member 610 are disposed to overlap each other in the height direction HD of the display panel 300, it is possible to prevent moisture and dust from penetrating between the display panel 300 and the frame 600. That is, a waterproof and dustproof display device 10 can be provided.

Meanwhile, the second force sensor 520 and the waterproofing member 610 are different from the first force sensor 510 and the waterproofing member 610 only in that the second force sensor 520 and the waterproofing member 610 are disposed on the left edge of the display panel 300. Therefore, a detailed description of the second force sensor 520 and the waterproofing member 610 will be omitted.

Figure 18:
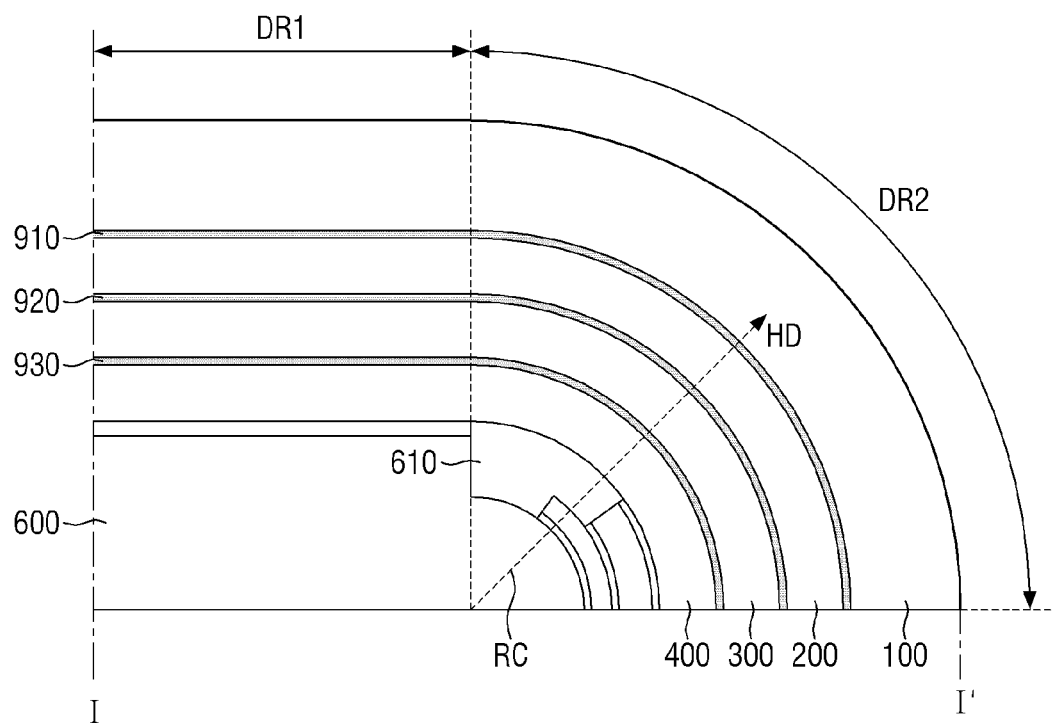
FIG. 18 is a cross-sectional view showing another example of I-I' of FIGS. 3 and 4.
Figure 18:
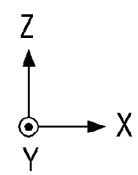
Figure 19:
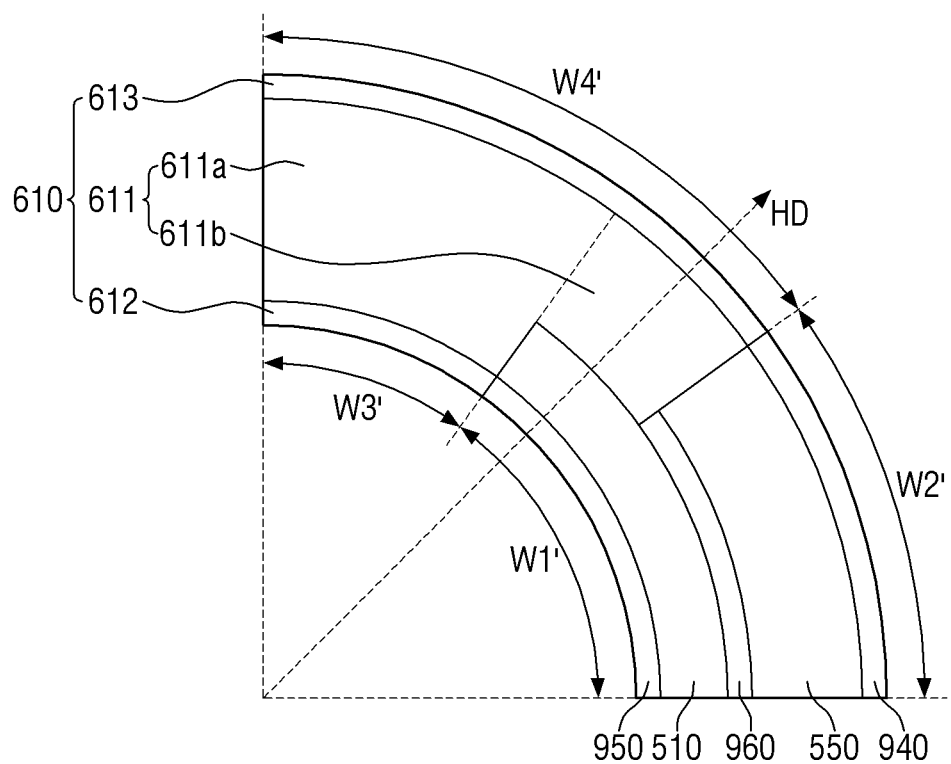
FIG. 19 is an enlarged view showing another example of the area B of FIG. 18.

FIG. 18 is a cross-sectional view showing another example of I-I' of FIGS. 3 and 4. FIG. 19 is an enlarged view showing another example of the area B of FIG. 18.

The exemplary embodiment shown in FIGS. 18 and 19 is different from the exemplary embodiment shown in FIGS. 14 and 15 in that the first bumps 550 are disposed on the first force sensor 510. Therefore, in FIGS. 18 and 19, a description overlapping the exemplary embodiment shown in FIGS. 14 and 15 will be omitted.

Referring to FIGS. 18 and 19, first bumps 550 may be disposed on the first force sensor 510. In this case, the upper surface of each of the first bumps 550 may be attached to the lower surface of the lower panel member 400 through a fourth adhesive member 940, and the lower surface of the first force sensor 510 may be attached to the upper surface of the frame 600 through a fifth adhesive member 950. Further, the lower surface of each of the first bumps 550 may be attached to the upper surface of the first force sensor 510 through the sixth adhesive member 960. The fourth adhesive member 940, the fifth adhesive member 950, and the sixth adhesive member 960 may be pressure-sensitive adhesive (PSA) members. Any one of the fourth adhesive member 940 and the fifth adhesive member 950 may be omitted.

A part of the first force sensor 510 and a part of the waterproofing member 610 may be disposed to overlap each other in the height direction HD of the display panel 300. The height direction HD of the display panel 300 indicates the Z axis direction in the first area DR1, but may indicate the extending direction of radius of curvature (RC) of the second area DR2 of the display panel 300 in the second area DR2 that is curved portion as shown in FIGS. 18 and 19. For this purpose, the width W1' of the first force sensor 510 in the first direction (X-axis direction) may be smaller than the width W2' of the first bump 550 in the first direction (X-axis direction). Further, the width W3 of the lower surface of the waterproof member 610 in the first direction (X-axis direction) may be smaller than the width W4 of the upper surface of the waterproofing member 610 in the first direction (X-axis direction). That is, the width W3 of the first adhesive film 612 in the first direction (X-axis direction) may be smaller than the width W4 of the second adhesive film 613 in the first direction (X-axis direction).

In order for a part of the first force sensor 510 and a part of the waterproofing member 610 to be disposed to overlap each other in the height direction HD of the display panel 300, the waterproofing member 610 may be formed in a "¬" shape. In this case, the base film 611 of the waterproofing member 610 may include a main portion 611a and a protrusion portion 611b protruding from the main portion 611a. The main portion 611a is a region where the first adhesive film 612 is formed on the lower surface thereof, and the protrusion portion 611b is a region overlapping a part of the first force sensor 510 in the height direction HD of the display panel 300. The protrusion portion 611b may be disposed on a part of the lower surface of the first force sensor 510 and on one side surface of the first bump 550.

Figure 20:
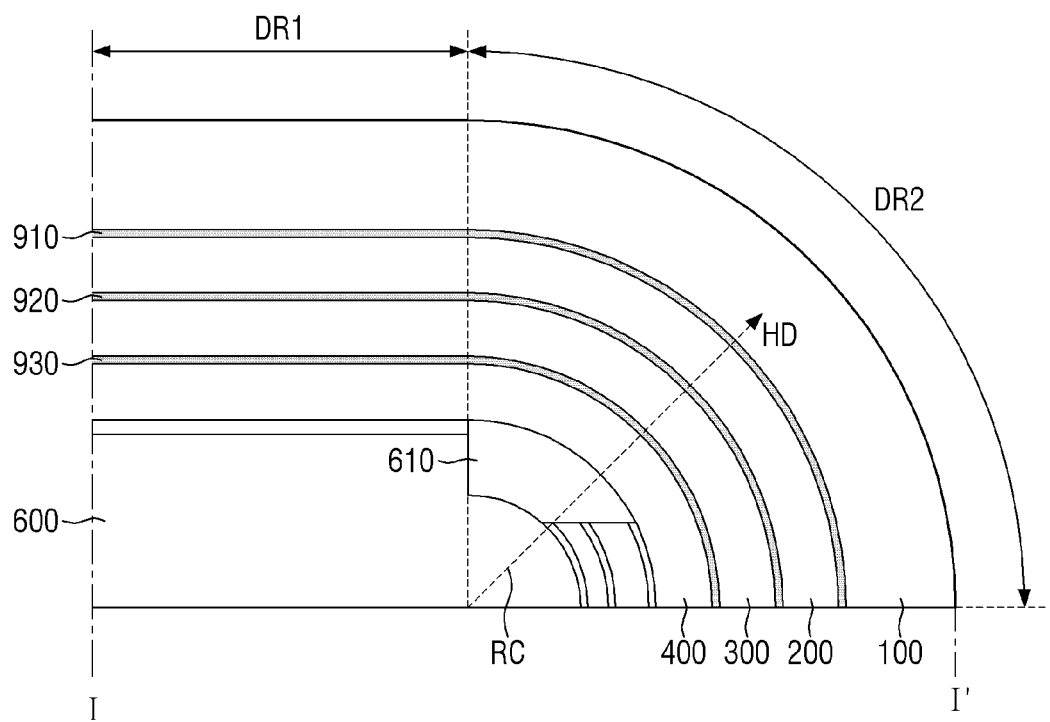
FIG. 20 is a cross-sectional view showing another example of I-I' of FIGS. 3 and 4.
Figure 21:
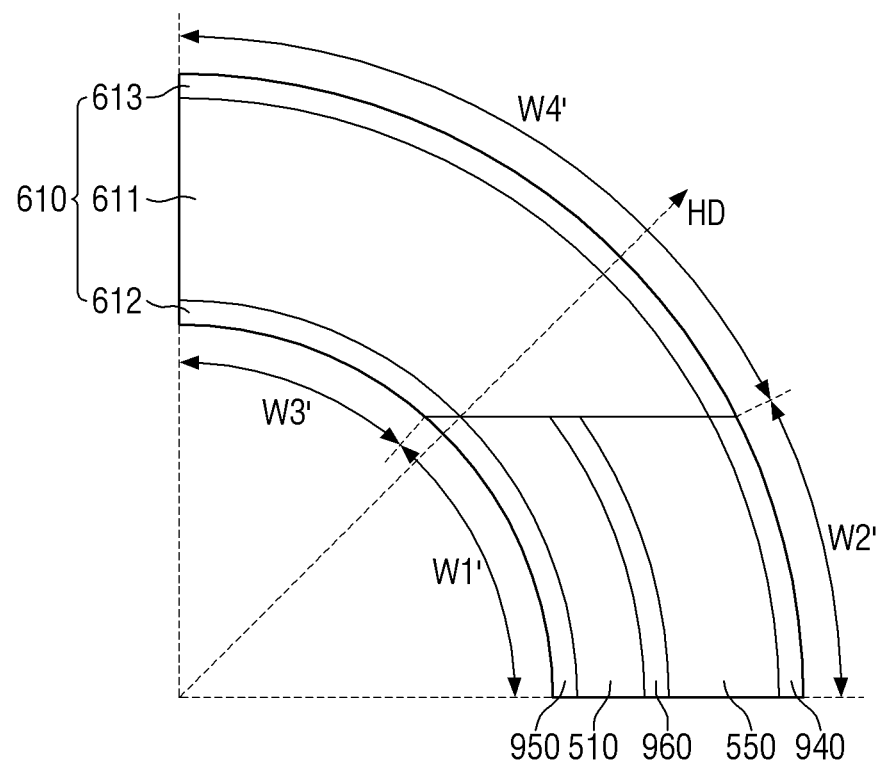
FIG. 21 is an enlarged view showing another example of the area B of FIG. 20.

Further, in order for a part of the first force sensor 510 and a part of the waterproofing member 610 to be disposed to overlap each other in the height direction HD of the display panel 300, as shown in FIGS. 20 and 21, one side surface of the first force sensor 510 facing the waterproofing member 610 and one side surface of each of the first bumps 550 may be formed obliquely with respect to the height direction HD of the display panel 300, and one side surface of the waterproofing member 610 facing the first force sensor 510 and the first bumps 550 may be formed obliquely with respect to the height direction HD of the display panel 300.

According to the exemplary embodiment shown in FIGS. 18, 19, 20, and 21, since a part of the first force sensor 510 and a part of the waterproof member 610 are disposed to overlap each other in the height direction HD of the display panel 300, it is possible to prevent moisture and dust from penetrating between the display panel 300 and the frame 600 by the first force sensor 510 and the waterproofing member 610. That is, a waterproof and dustproof display device 10 can be provided.

Meanwhile, the second force sensor 520 and the waterproofing member 610 are different from the first force sensor 510 and the waterproofing member 610 only in that the second force sensor 520 and the waterproofing member 610 are disposed on the left edge of the display panel 300. Therefore, a detailed description of the second force sensor 520 and the waterproofing member 610 will be omitted.

Figure 22:
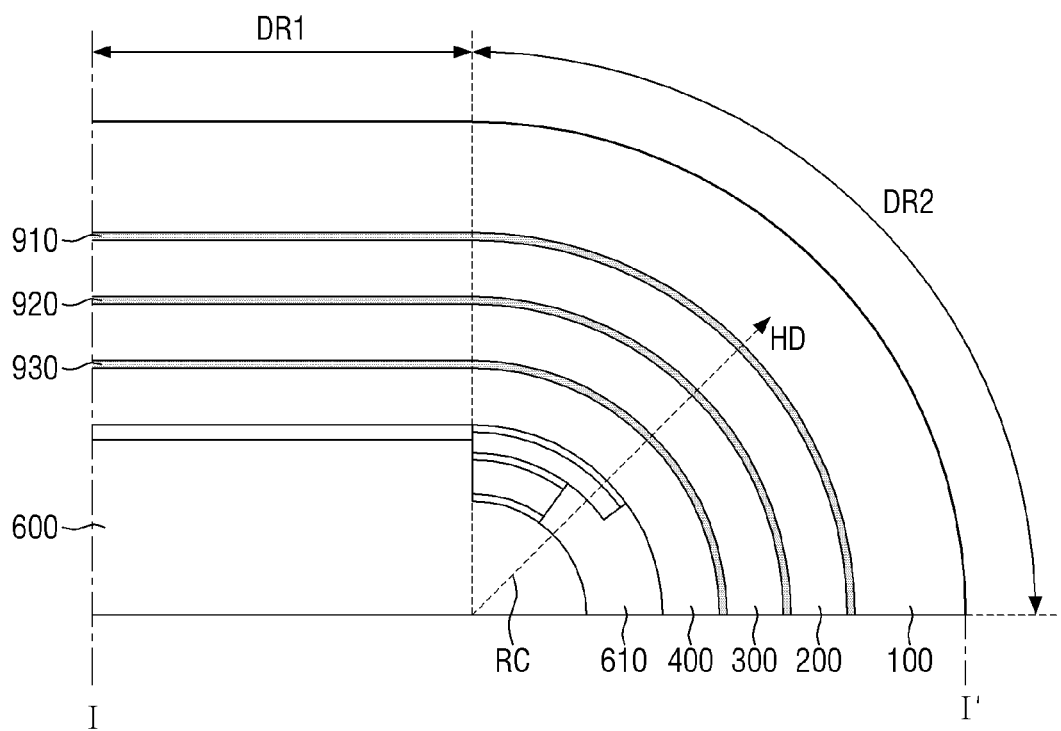
FIG. 22 is a cross-sectional view showing another example of I-I' of FIGS. 3 and 4.
Figure 23:
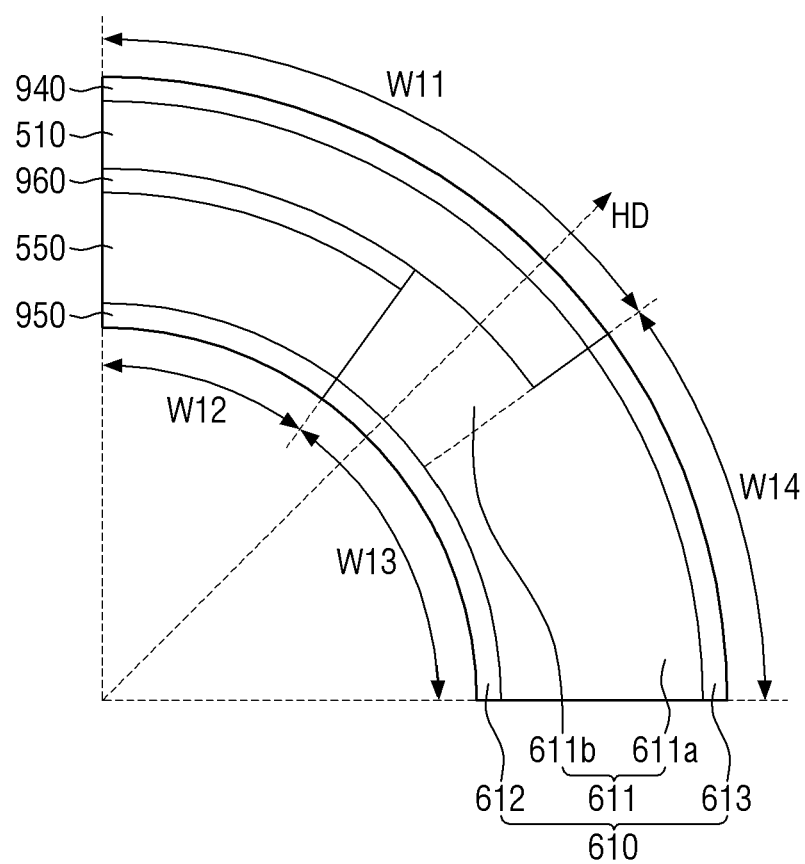
FIG. 23 is an enlarged view showing another example of the area B of FIG. 22.

FIG. 22 is a cross-sectional view showing another example of I-I' of FIGS. 3 and 4. FIG. 23 is an enlarged view showing another example of the area B of FIG. 22.

The exemplary embodiment shown in FIGS. 22 and 23 is different from the exemplary embodiment shown in FIGS. 14 and 15 in that the first bumps 550 are disposed on the outer side of the first force sensor 510. Therefore, in FIGS. 22 and 23, a description overlapping the exemplary embodiment shown in FIGS. 14 and 15 will be omitted.

Referring to FIGS. 22 and 23, the waterproofing member 610 may be disposed on the outer side of the first force sensor 510. That is, the waterproofing member 610 may be disposed on one side surface of the first force sensor 510, and one side surface of the first force sensor 510 may be disposed close to one side edge of the display panel 300 as compared with other side surfaces of the first force sensor 510. For example, as shown in FIG. 22, when the first force sensor 510 is disposed at the right edge of the display panel 300, the outer side of the first force sensor 510 indicates the right outer side. The waterproofing member 610 may be disposed on the right side surface of the first force sensor 510.

A part of the first force sensor 510 and a part of the waterproofing member 610 may be disposed to overlap each other in the height direction HD of the display panel 300. The height direction HD of the display panel 300 indicates the Z axis direction in the first area DR1, but may indicate the extending direction of radius of curvature (RC) of the second area DR2 of the display panel 300 in the second area DR2 that is curved portion as shown in FIGS. 22 and 23. For this purpose, the width W11 of the first force sensor 510 in the first direction (X-axis direction) may be larger than the width W12 of the first bump 550 in the first direction (X-axis direction). Further, the width W13 of the lower surface of the waterproof member 610 in the first direction (X-axis direction) may be larger than the width W14 of the upper surface of the waterproofing member 610 in the first direction (X-axis direction).

In order for a part of the first force sensor 510 and a part of the waterproofing member 610 to be disposed to overlap each other in the height direction HD of the display panel 300, the waterproofing member 610 may be formed in a left-right reversed "¬" shape. In this case, the base film 611 of the waterproofing member 610 may include a main portion 611a and a protrusion portion 611b protruding from the main portion 611a. The main portion 611a is a region where the second adhesive film 613 is formed on the upper surface thereof, and the protrusion portion 611b is a region overlapping a part of the first force sensor 510 in the height direction HD of the display panel 300. The protrusion portion 611b may be disposed on a part of the lower surface of the first force sensor 510 and on one side surface of the first bump 550.

Figure 24:
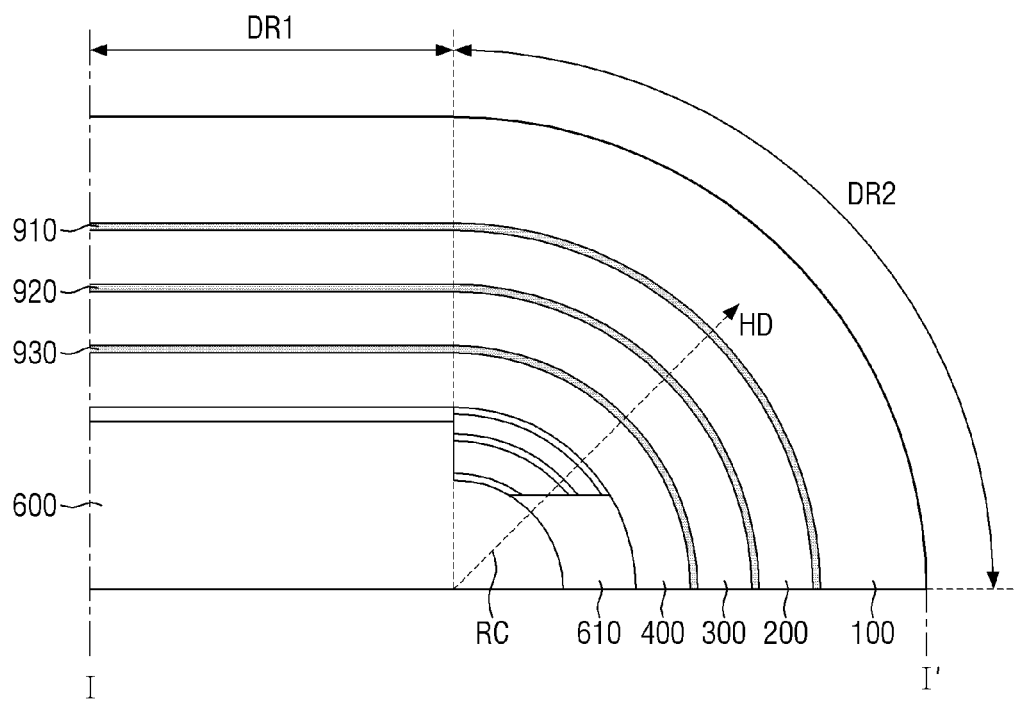
FIG. 24 is a cross-sectional view showing another example of I-I' of FIGS. 3 and 4.
Figure 25:
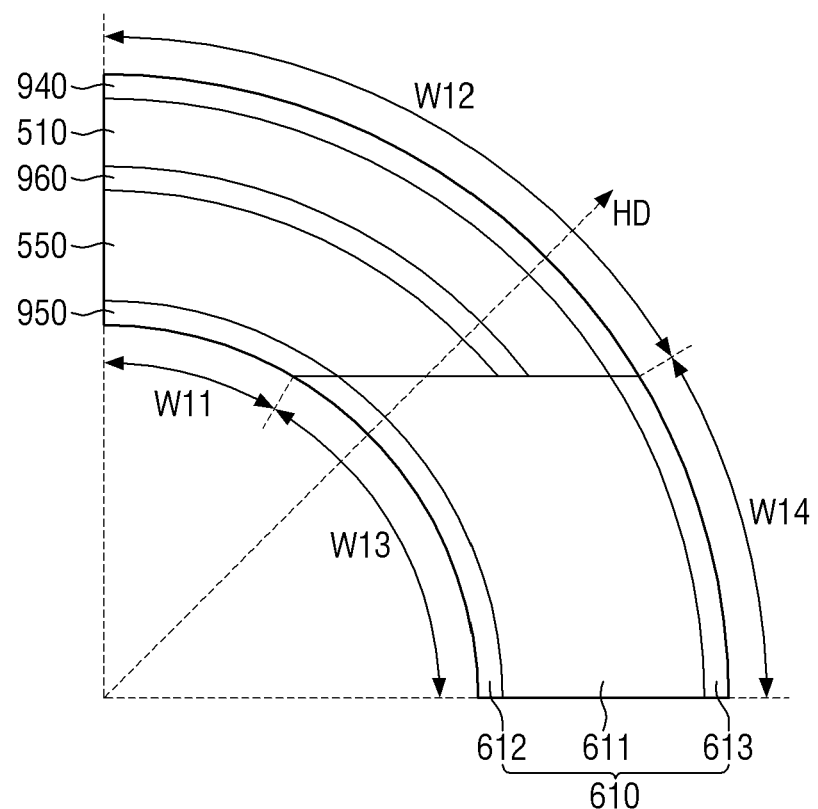
FIG. 25 is an enlarged view showing another example of the area B of FIG. 24.

Further, in order for a part of the first force sensor 510 and a part of the waterproofing member 610 to be disposed to overlap each other, as shown in FIGS. 24 and 25, one side surface of the first force sensor 510 facing the waterproofing member 610 and one side surface of each of the first bumps 550 may be formed obliquely with respect to the height direction HD of the display panel 300, and one side surface of the waterproofing member 610 facing the first force sensor 510 and the first bumps 550 may be formed obliquely with respect to the height direction HD of the display panel 300.

According to the exemplary embodiment shown in FIGS. 22, 23, 24, and 25, since a part of the first force sensor 510 and a part of the waterproof member 610 are disposed to overlap each other in the height direction HD of the display panel 300, it is possible to prevent moisture and dust from penetrating between the display panel 300 and the frame 600. That is, a waterproof and dustproof display device 10 can be provided.

Meanwhile, the second force sensor 520 and the waterproofing member 610 are different from the first force sensor 510 and the waterproofing member 610 only in that the second force sensor 520 and the waterproofing member 610 are disposed on the left edge of the display panel 300. Therefore, a detailed description of the second force sensor 520 and the waterproofing member 610 will be omitted.

Figure 26:
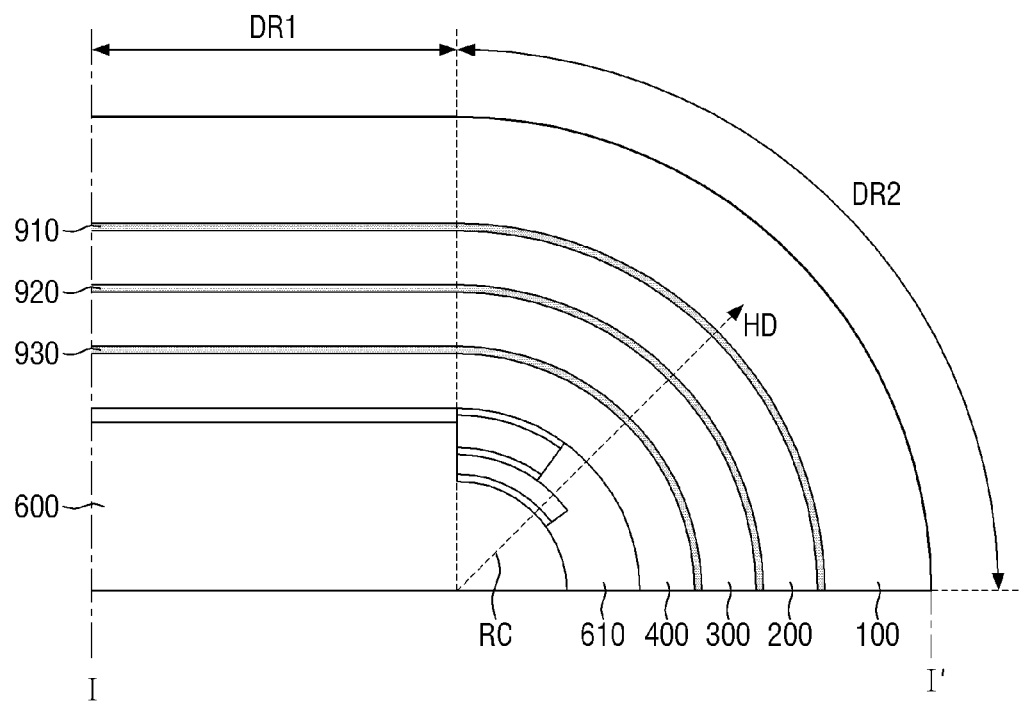
FIG. 26 is a cross-sectional view showing another example of I-I' of FIGS. 3 and 4.
Figure 27:
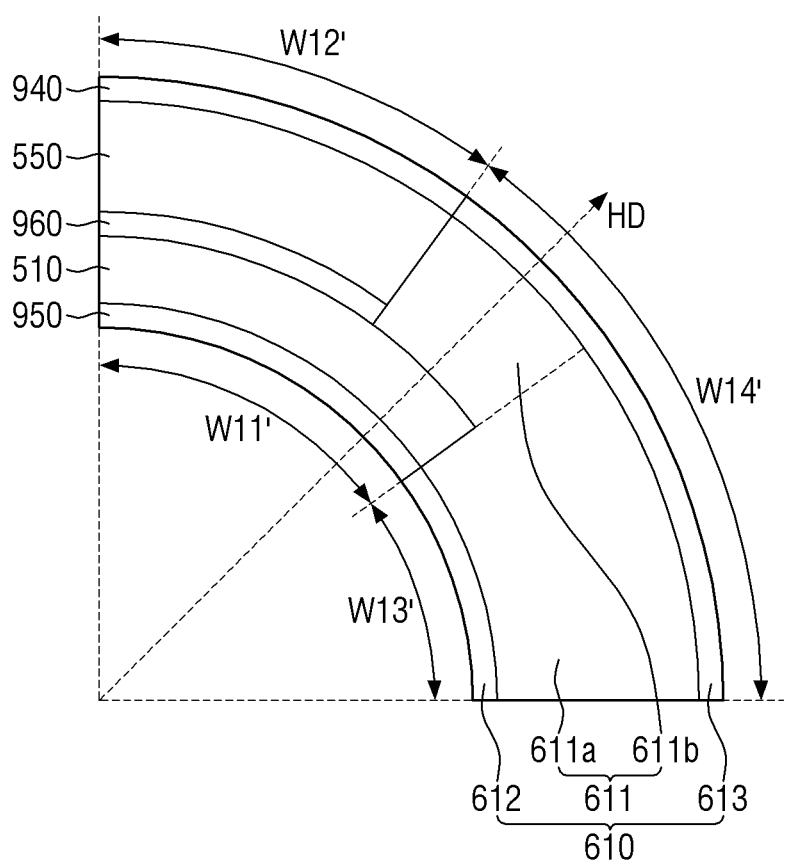
FIG. 27 is an enlarged view showing another example of the area B of FIG. 26.

FIG. 26 is a cross-sectional view showing another example of I-I' of FIGS. 3 and 4. FIG. 27 is an enlarged view showing another example of the area B of FIG. 26.

The exemplary embodiment shown in FIGS. 26 and 27 is different from the exemplary embodiment shown in FIGS. 14 and 15 in that the first bumps 550 are disposed on the outer side of the first force sensor 510, and are disposed on the first force sensor 510. Therefore, in FIGS. 26 and 27, a description overlapping the exemplary embodiment shown in FIGS. 14 and 15 will be omitted.

Referring to FIGS. 26 and 27, first bumps 550 may be disposed on the first force sensor 510. In this case, the upper surface of each of the first bumps 550 may be attached to the lower surface of the lower panel member 400 through a fourth adhesive member 940, and the lower surface of the first force sensor 510 may be attached to the upper surface of the frame 600 through a fifth adhesive member 950. Further, the lower surface of each of the first bumps 550 may be attached to the upper surface of the first force sensor 510 through the sixth adhesive member 960. The fourth adhesive member 940, the fifth adhesive member 950, and the sixth adhesive member 960 may be pressure-sensitive adhesive (PSA) members. Any one of the fourth adhesive member 940 and the fifth adhesive member 950 may be omitted.

The waterproofing member 610 may be disposed on the outer side of the first force sensor 510. That is, the waterproofing member 610 may be disposed on one side surface of the first force sensor 510, and one side surface of the first force sensor 510 may be disposed close to one side edge of the display panel 300 as compared with other side surfaces of the first force sensor 510. For example, as shown in FIG. 26, when the first force sensor 510 is disposed at the right edge of the display panel 300, the outer side of the first force sensor 510 indicates the right outer side. The waterproofing member 610 may be disposed on the right side surface of the first force sensor 510.

A part of the first force sensor 510 and a part of the waterproofing member 610 may be disposed to overlap each other in the height direction HD of the display panel 300. The height direction HD of the display panel 300 indicates the Z axis direction in the first area DR1, but may indicate the extending direction of radius of curvature (RC) of the second area DR2 of the display panel 300 in the second area DR2 that is curved portion as shown in FIGS. 26 and 27. For this purpose, the width W11' of the first force sensor 510 in the first direction (X-axis direction) may be larger than the width W12' of the first bump 550 in the first direction (X-axis direction). Further, the width W13' of the lower surface of the waterproof member 610 in the first direction (X-axis direction) may be smaller than the width W14' of the upper surface of the waterproofing member 610 in the first direction (X-axis direction). That is, the width W13 of the first adhesive film 612 in the first direction (X-axis direction) may be smaller than the width W14 of the second adhesive film 613 in the first direction (X-axis direction).

In order for a part of the first force sensor 510 and a part of the waterproofing member 610 to be disposed to overlap each other in the height direction HD of the display panel 300, the waterproofing member 610 may be formed in a left-right reversed "¬" shape. In this case, the base film 611 of the waterproofing member 610 may include a main portion 611a and a protrusion portion 611b protruding from the main portion 611a. The main portion 611a is a region where the first adhesive film 612 is formed on the lower surface thereof, and the protrusion portion 611b is a region overlapping a part of the first force sensor 510 in the height direction HD of the display panel 300. The protrusion portion 611b may be disposed on a part of the lower surface of the first force sensor 510 and on one side surface of the first bump 550.

Figure 28:
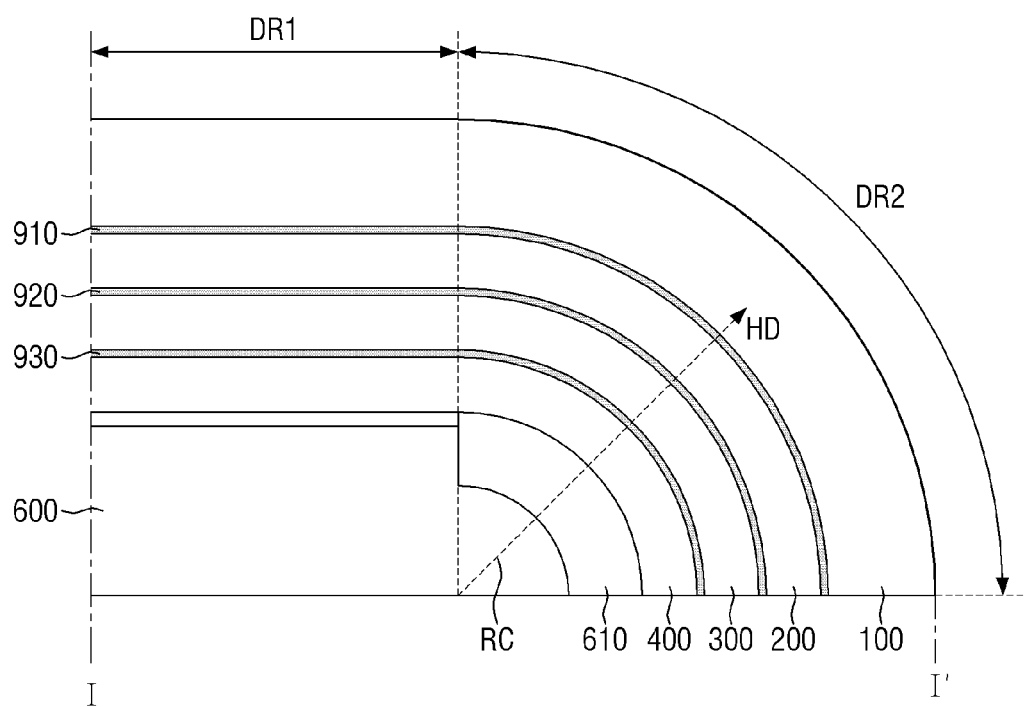
FIG. 28 is a cross-sectional view showing another example of I-I' of FIGS. 3 and 4.
Figure 29:
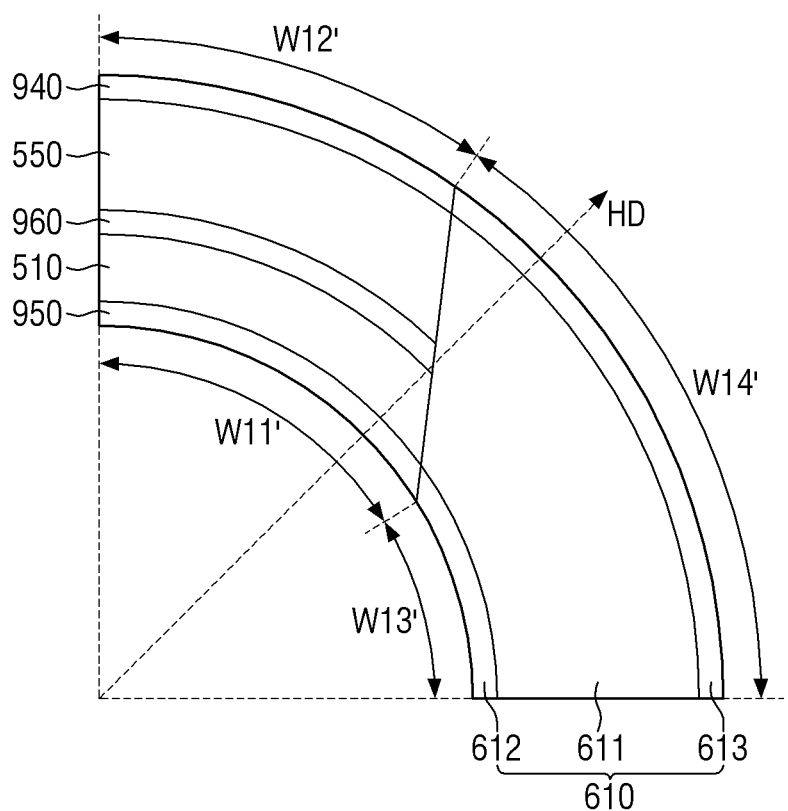
FIG. 29 is an enlarged view showing another example of the area B of FIG. 28.

Further, in order for a part of the first force sensor 510 and a part of the waterproofing member 610 to be disposed to overlap each other, as shown in FIGS. 27 and 28, one side surface of the first force sensor 510 facing the waterproofing member 610 and one side surface of each of the first bumps 550 may be formed obliquely with respect to the height direction HD of the display panel 300, and one side surface of the waterproofing member 610 facing the first force sensor 510 and the first bumps 550 may be formed obliquely with respect to the height direction HD of the display panel 300.

According to the exemplary embodiment shown in FIGS. 26, 27, 28, and 29, since a part of the first force sensor 510 and a part of the waterproof member 610 are disposed to overlap each other in the height direction HD of the display panel 300, it is possible to prevent moisture and dust from penetrating between the display panel 300 and the frame 600. That is, a waterproof and dustproof display device 10 can be provided.

Meanwhile, the second force sensor 520 and the waterproofing member 610 are different from the first force sensor 510 and the waterproofing member 610 only in that the second force sensor 520 and the waterproofing member 610 are disposed on the left edge of the display panel 300. Therefore, a detailed description of the second force sensor 520 and the waterproofing member 610 will be omitted.

As described above, according to the display device of an exemplary embodiment, a part of the first force sensor and a part of the waterproofing member are arranged so as to overlap each other in the height direction of the display panel, so that it is possible to prevent moisture and dust from penetrating between the display panel and the frame to the first force sensor. That is, a waterproof and dustproof display device can be provided.

Further, according to the display device of an exemplary embodiment, the force sensor is disposed on the curved surface portion of the display device, so that the force sensors can be utilized as physical buttons such as a sound control button, a power button, a call button, a camera button, an internet button, and a squeezing button.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
    a display panel including a flat portion and a curved portion extended from the flat portion;
    a frame disposed under the flat portion and the curved portion of the display panel;
    a force sensor disposed between the curved portion of the display panel and the frame; and
    a waterproofing member disposed between the curved portion of the display panel and the frame,
    wherein a height of the waterproofing member is higher than a height of the force sensor.

2. The display device of claim 1, the waterproofing member is contact with the display panel.

3. The display device of claim 2, the waterproofing member includes:
    a base film;
    a first adhesive film disposed on one surface of the base film and attached to a lower surface of the base film; and
    a second adhesive film disposed on other surface of the base film and attached to the upper surface of the base film.

4. The display device of claim 3, wherein the base film includes:
    a main portion; and
    a protrusion portion protruding from the main portion.

5. The display device of claim 4, wherein
the main portion has a first width, and
the protrusion portion has a second width different from the first width.

6. The display device of claim 5, wherein the first width is smaller than the second width.

7. The display device of claim 4, wherein
the main portion has a first height, and
the protrusion portion has a second height different from the first height.

8. The display device of claim 7, wherein the first height is smaller than the second height.

9. The display device of claim 4, wherein the main portion is in contact with the force sensor.

10. The display device of claim 4, further comprising:
a bump disposed on one surface of the force sensor.

11. The display device of claim 10, wherein the protrusion portion is in contact with the bump.

12. The display device of claim 10, wherein a width of the force sensor is larger than a width of the bump.

13. The display device of claim 10, wherein a height of the force sensor is smaller than a height of the bump.

14. The display device of claim 10, further comprising:
a first adhesive member between the force sensor and the display panel, and
a second adhesive member between the force sensor and the display panel.

15. The display device of claim 1, further comprising:
a bump disposed on one surface of the force sensor,
wherein the force sensor and the bump are in contact with a side surface of the waterproofing member.

16. The display device of claim 1, wherein the force sensor is disposed at an outer side of the waterproofing member.

17. The display device of claim 1, wherein the waterproofing member is disposed at an outer side of the force sensor.

18. A display device, comprising:
a display panel including a flat portion and a curved portion extended from the flat portion;
a force sensor disposed under the curved portion of the display panel; and
a waterproofing member disposed under the curved portion of the display panel
wherein the force sensor is disposed at an outer side of the waterproofing member, and
wherein the waterproofing member does not overlap the flat portion of the display panel in a thickness direction of the display panel.

19. The display device of claim 18, further comprising:
a bump disposed between the force sensor and the display panel.

20. A display device, comprising:
a display panel including a flat portion and a curved portion extended from the flat portion;
a force sensor disposed under the curved portion of the display panel; and
a waterproofing member disposed under the curved portion of the display panel and is in contact with the display panel, the waterproofing member including:
a base film including a main portion; and a protrusion portion protruding from the main portion;
a first adhesive film disposed on one surface of the base film and attached to a lower surface of the base film; and
a second adhesive film disposed on other surface of the base film and attached to an upper surface of the base film,
wherein the waterproofing member is disposed at an outer side of the force sensor.

* * * * *